(12) United States Patent
Nemoto

(10) Patent No.: US 7,919,790 B2
(45) Date of Patent: Apr. 5, 2011

(54) SEMICONDUCTOR DEVICE AND METHOD OF PRODUCING THE SAME

(75) Inventor: Michio Nemoto, Higashichikuma Gun (JP)

(73) Assignee: Fuji Electric Systems Co., Ltd. (JP)

( * ) Notice: Subject to any disclaimer, the term of this patent is extended or adjusted under 35 U.S.C. 154(b) by 158 days.

(21) Appl. No.: 12/367,540

(22) Filed: Feb. 8, 2009

(65) Prior Publication Data

US 2009/0224284 A1 Sep. 10, 2009

(30) Foreign Application Priority Data

Feb. 8, 2008 (JP) ................................. 2008-029257

(51) Int. Cl.
*H01L 29/866* (2006.01)
*H01L 29/88* (2006.01)

(52) U.S. Cl. . 257/106; 257/481; 257/603; 257/E29.335; 438/91; 438/380

(58) Field of Classification Search .................. 257/106, 257/112, 199, 481, 551, 603, E29.335, E27.051; 438/91, 380, 570, 983
See application file for complete search history.

(56) References Cited

U.S. PATENT DOCUMENTS

| 5,093,693 A * | 3/1992 | Abbas et al. .................. 257/106 |
| 2001/0005024 A1 | 6/2001 | Bauer et al. |
| 2002/0130331 A1 | 9/2002 | Nemoto et al. |
| 2004/0041225 A1 | 3/2004 | Nemoto |
| 2007/0108558 A1 | 5/2007 | Nemoto |

FOREIGN PATENT DOCUMENTS

| JP | 04-252078 A | 9/1992 |
| JP | 5-102161 A | 4/1993 |
| JP | 7-297415 A | 10/1995 |
| JP | 2002-520885 A | 7/2002 |
| JP | 2003-152198 A | 5/2003 |

(Continued)

OTHER PUBLICATIONS

Power Device & Power IC Handbook, edited by the Institute of Electrical Engineers of Japan, High Performance and High Function Power Device and Power IC Investigation and Research Committee, first edition, pp. 68-71, Corona Publishing Co., Ltd., Jul. 30, 1996.

*Primary Examiner* — Hoai v Pham
(74) *Attorney, Agent, or Firm* — Rossi Kimms & McDowell LLP

(57) ABSTRACT

A semiconductor substrate and a method of its manufacture has a semiconductor substrate having a carbon concentration in a range of $6.0 \times 10^{15}$ to $2.0 \times 10^{17}$ atoms/cm$^3$, both inclusively. One principal surface of the substrate is irradiated with protons and then heat-treated to thereby form a broad buffer structure, namely a region in a first semiconductor layer where a net impurity doping concentration is locally maximized. Due to the broad buffer structure, lifetime values are substantially equalized in a region extending from an interface between the first semiconductor layer and a second semiconductor layer formed on the first semiconductor layer to the region where the net impurity doping concentration is locally maximized. In addition, the local minimum of lifetime values of the first semiconductor layer becomes high. It is thus possible to provide a semiconductor device having soft recovery characteristics, in addition to high-speed and low-loss characteristics, while suppressing a kinked leakage current waveform.

14 Claims, 24 Drawing Sheets

FOREIGN PATENT DOCUMENTS

| | | |
|---|---|---|
| JP | 2003-224134 A | 8/2003 |
| JP | 2006-332127 A | 8/2003 |
| JP | 2003-318412 A | 11/2003 |
| JP | 2006-69852 A | 3/2006 |
| JP | 2006-352101 A | 12/2006 |
| JP | 2007-96348 A | 4/2007 |
| JP | 2007-123932 A | 5/2007 |
| JP | 2007-158320 A | 6/2007 |
| JP | 2007-266233 A | 10/2007 |
| WO | 2007/055352 A1 | 5/2007 |

* cited by examiner

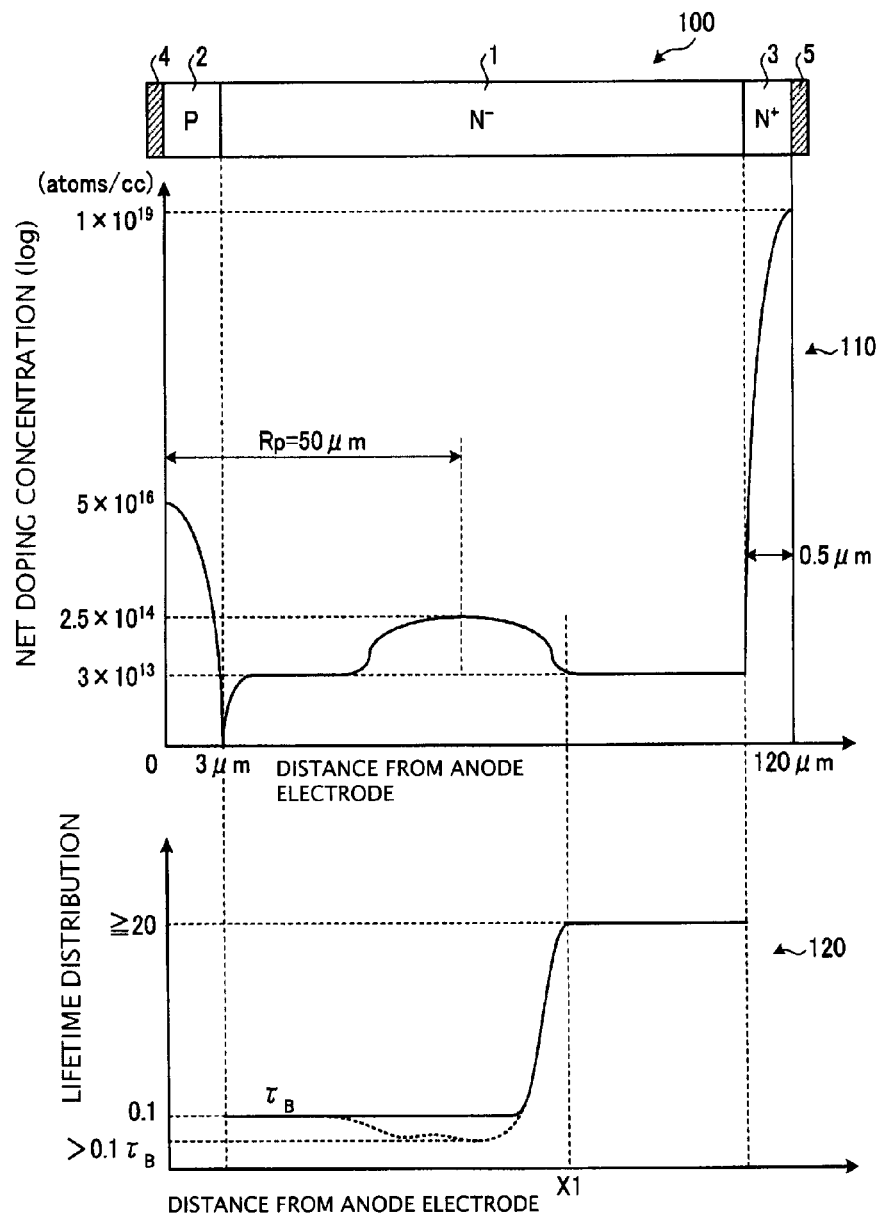

SEMICONDUCTOR DEVICE AND METHOD OF PRODUCING THE SAME

BACKGROUND

There are diodes, Insulated Gate Bipolar Transistors (IGBTs), etc., of a 600V, 1200V, or 1700V withstand voltage class, as power semiconductor devices. Improvements of characteristics of these devices have advanced recently. The power semiconductor devices are used in power conversion systems, such as a high-efficiency power-saving converter-inverter system, and essential for controlling rotation motors and servomotors.

Characteristics of low loss, power saving, high speed, high efficiency, and environmental friendliness, i.e., no bad influence on surroundings are required of such a power controller. For these requirements, there is commonly known a method of thinning the rear surface of a typical semiconductor substrate (e.g. silicon wafer) by grinding or the like after forming the front surface side region of the semiconductor substrate, and then performing ion implantation of an element with a predetermined concentration from the ground surface side, followed by heat treatment. See JP-T-2002-520885, which corresponds to USPGP 2001/005024 (Patent Document 1). Incidentally, the carrier frequencies of these IGBTs are to be extended to not less than 1 to 10 kHz.

A diode having a broad buffer structure has been further proposed. The broad buffer structure is a structure in which the average concentration distribution of an $N^-$ drift layer has a peak (local maximum) substantially near the midpoint of the $N^-$ drift layer so that the concentration decreases with a gradient toward both anode and cathode sides. See JP-A-2003-318412, which corresponds to USPGP 2004/041225 (Patent Document 2).

The broad buffer structure type diode can achieve soft recovery characteristics and oscillation suppressing effect in a high-speed operation (e.g., carrier frequency: 20 kHz or higher) that could hardly be made by a conventional technique of controlling a lifetime distribution while reducing emitter implantation efficiency. As a method for producing the broad buffer structure type diode, Patent Document 2 discloses a method in which an FZ (float zone) bulk wafer is irradiated with protons ($H^+$) and heat treated to thereby provide hydrogen-related defect complex (HRDC), as donors near a projected range Rp inside the bulk.

Besides Patent Document 2, various methods of forming a high-concentration $N^+$ layer using the phenomenon that HRDC are provided as donors by proton irradiation and heat treatment have been proposed. See WO 2007/055352 (Patent Document 3). Specifically, a method of forming an N-type buffer layer with a predetermined thickness in a predetermined position of an N-type drift layer is commonly known. See JP-A-2003-152198, which corresponds to USPGP 2002/130331. A method of forming an N buffer layer between an $N^-$ drift layer and an $N^+$ cathode layer with the N buffer layer higher in impurity concentration than the $N^-$ drift layer and lower in impurity concentration than the $N^+$ cathode layer and thicker than the $N^+$ cathode layer is also commonly known. See JP-A-2007-158320, which corresponds to USPGP 2007/108558).

There has been further proposed a method in which defects are formed in a silicon wafer by irradiation with ions of a low-mass element on the periodic table, such as protons or helium ions, and the remaining defects are adjusted by heat treatment to thereby reduce lifetime locally. See *Power Device & Power IC Handbook*, edited by the Institute of Electrical Engineers of Japan, High Performance and High Function Power Device and Power IC Investigation and Research Committee, first edition, pp. 68-71, CORONA Publishing Co., Ltd., Jul. 30, 1996.

When a diode is switched from an ON state to an OFF state (at the time of reverse recovery), a space charge region is spread in an $N^-$ drift layer from an anode side toward a cathode side. On this occasion, carriers stored in the drift layer (hereinafter referred to as "stored carriers") are swept out by the spreading of the space charge region, so that the carrier concentration of the drift layer decreases rapidly. If the spreading of the space charge region per unit voltage is too wide, a larger part of the stored carriers are swept out so that the stored carriers in the drift layer are exhausted in the middle of reverse recovery. Consequently, so-called snappy reverse recovery (hard recovery) occurs so that both reverse recovery voltage and current can produce undesirable oscillated waveforms.

As disclosed in Patent Document 2, in the broad buffer diode according to the related art, the spreading of the space charge region is suppressed by the pinning effect of the space charge region (i.e., the phenomenon that expansion of the depletion layer is stopped at the buffer layer) to prevent the stored carriers from being exhausted to thereby suppress oscillation of both reverse recovery voltage and current. In addition, both conduction loss and reverse recovery loss can be reduced because the thickness of the $N^-$ layer can be reduced while the withstand voltage is kept high.

However, reduction of the reverse recovery current value at the time of reverse recovery and reduction of the current decreasing rate until the reverse recovery current's reaching zero as well as suppression of oscillation are required of the diode. This is because reduction of the reverse recovery current to a small value brings an effect on reducing the peak current at the turn-on of a counter arm IGBT to thereby reduce turn-on loss. This is further because reduction of the current decreasing rate at the time of reverse recovery brings an effect on reducing the surge voltage of the diode caused by the stray inductance of the electric circuit.

Although suppression of the surge voltage in the broad buffer structure type diode has been disclosed in the related art documents, there is no description about reducing the reverse recovery current. Adjustment of the carrier concentration of other portions than the broad buffer structure is therefore required for reducing the reverse recovery current. Specifically, there is a problem awaiting solution that implantation of a low concentration of minority carriers into an anode layer as a surface layer of the wafer or lifetime control of the minority carriers must be performed.

Moreover, the lifetime distribution after proton irradiation becomes a distribution in which the lifetime value is locally minimized near the projected range Rp. This reason is that the density of lattice defects is maximized near the projected range Rp in which protons are most localized. The leakage current value $J_R$ when the PiN diode having such a lifetime distribution is reverse biased is given by the following expression (1).

$$J_R = q\left(\sqrt{\frac{D_p}{\tau_p}} + \sqrt{\frac{D_n}{\tau_n}}\right)\frac{n_i^2}{N_D} + \frac{qn_iW}{\tau_e}, \quad (1)$$

where q is the elementary electric charge, $D_p$ is the diffusion coefficient of holes, $D_n$ is the diffusion coefficient of electrons, $\tau_p$ is the lifetime of holes, $\tau_n$ is the lifetime of electrons, $n_i$ is the carrier concentration of an impurity-free intrinsic semiconductor (i.e., the intrinsic carrier concentration), W is the width of a depletion layer spread in the diode, and $\tau_e$ is the effective lifetime in the depletion layer.

When the diffusion current is sufficiently small, only the current produced in the depletion layer as represented by the second term of the above expression (1) substantially contributes to the leakage current value $J_R$. Accordingly, the maximum of the leakage current value $J_R$ is decided by the minimum $\tau_{min}$ of the effective lifetime $\tau_e$ in the depletion layer. In a broad buffer structure type diode formed by proton irradiation and heat treatment (annealing) in the related art method, the leakage current value becomes large because, for example, $\tau_{min}$ is about 30 ns, which is shorter than $\tau_{min}$ of about 600 ns in a broad buffer structure type diode formed by electron beam irradiation applied to an epitaxial wafer. As a result, in the diode formed by proton irradiation in the related art method, the leakage current can produce kinked waveforms that can cause heat runaway of the device.

Accordingly there remains a need to suppress the kinked waveforms in a semiconductor device having soft recovery characteristics in addition to high speed and low-loss characteristics. The present invention addresses this need.

SUMMARY OF THE INVENTION

The present invention relates to a semiconductor device, such as a diode or an IGBT, having soft recovery characteristics in addition to high-speed and low-loss characteristics, and a method of its manufacture.

One aspect of the present invention relates to a semiconductor device. The semiconductor device can include a semiconductor substrate of a first conductivity having a first principal surface and a second principal surface and serving as a first semiconductor layer of the first conductivity type, a second semiconductor layer of a second conductivity type, a third semiconductor layer of the first conductivity type, a first electrode, and a second electrode.

The second semiconductor layer can have a higher impurity concentration than the first semiconductor layer and is in contact with at least part of the first semiconductor layer on the first principal surface of the first semiconductor layer. The third semiconductor layer can have a higher impurity concentration than the first semiconductor layer and on a side of the second principal surface of the first semiconductor layer. The first electrode can be contact with at least part of the second semiconductor layer and the second electrode can be in contact with at least part of the third semiconductor layer.

The first semiconductor layer can include at least one region where the impurity concentration is locally maximized so that its impurity concentration decreases from the locally maximized region toward both the second and third semiconductor layers. A carbon concentration of the semiconductor substrate can be in a range of $6.0 \times 10^{15}$ to $2.0 \times 10^{17}$ atoms/cm$^3$, both inclusively.

The third semiconductor layer can be in contact with the first semiconductor layer. Alternatively, a fourth semiconductor layer of the first conductivity type can be provided between and in contact with the first and third semiconductor layers and can have a higher impurity concentration than the first semiconductor layer but lower in impurity concentration than the third semiconductor layer. A full width at half maximum of the fourth semiconductor layer can be in a range of 0.2 µm to 1.0 µm, both inclusively, or more preferably 0.2 µm to 0.5 µm, both inclusively.

The carrier lifetime values of minority carriers in a region extending from an interface between the first and second semiconductor layers to a third semiconductor layer-side end portion X1 where the impurity concentration of the first semiconductor layer is locally maximized are shorter than carrier lifetime values of minority carriers in a region extending from the end portion X1 to an interface between the first and third semiconductor layers.

The carrier lifetime values of minority carriers in the region extending from the interface between the first and second semiconductor layers to the third semiconductor layer-side end portion X1 of the region where the impurity concentration of the first semiconductor layer is locally maximized are substantially uniform.

The difference between a minimum and a maximum of the carrier lifetime values of minority carriers in the region extending from the interface between the first and second semiconductor layers to a position closer to the third semiconductor layer-side end portion X1 where the impurity concentration of the first semiconductor layer is locally maximized is not longer than 10 times.

The carrier lifetime values of minority carriers in the region extending from the third semiconductor layer-side end portion X1 of the region where the impurity concentration of the first semiconductor layer is locally maximized to the interface between the first and third semiconductor layers are not shorter than 20 µs.

The region where the impurity concentration of the first semiconductor layer is locally maximized can contain hydrogen atoms, which are donors.

A minimum impurity concentration of the first semiconductor layer can be equal to or less than an impurity concentration of the semiconductor substrate and not higher than 20% of the impurity concentration of the region where the impurity concentration of the first semiconductor layer is locally maximized.

Another aspect of the present invention relates to a method of producing the semiconductor device described above. The method can include a second semiconductor layer forming step of forming the second semiconductor layer in the first principal surface of the semiconductor substrate, and a first irradiating step of irradiating the first principal surface of the semiconductor substrate with hydrogen ions at an acceleration voltage of not lower than 5 MeV. The method further includes a heat-treating step of heat treating the semiconductor substrate at a temperature of 200° C. to 350° C., both inclusively, to form the at least one region in the first semiconductor layer where the impurity concentration is locally maximized. The method further includes a grinding step of grinding the second principal surface of the semiconductor substrate, and an implanting step of implanting an impurity of the first conductivity type into the ground second principal surface of the semiconductor substrate. The method can further include a second irradiating step of irradiating the ground second principal surface implanted with the impurity of the first conductivity type, with a laser beam to electrically activate the implanted impurity and form the third semiconductor layer.

Further, the method can include an intermediate irradiating step of irradiating the ground second principal surface with hydrogen ions before the implanting step. The second irradiating step electrically activates the hydrogen ions irradiated in the intermediate irradiating step to form the fourth semiconductor layer and the impurity of the first conductivity implanted on the implanting step to form the third semiconductor layer.

Another aspect of the present invention includes a method of producing a semiconductor device using a semiconductor substrate of a first conductivity type having a first principal surface and a second principal surface. The semiconductor substrate has a carbon concentration of $6.0 \times 10^{15}$ atoms/cm$^3$ to $2.0 \times 10^{17}$ atoms/cm$^3$, both inclusively. Here, the method includes a first irradiating step of irradiating the first principal surface of the semiconductor substrate with hydrogen ions at an acceleration voltage of not lower than 5 MeV. The method further includes a heat-treating step of heat treating the semiconductor substrate at a temperature of 200° C. to 350° C., both inclusively, to form a region having a locally maximized net doping concentration and a region having carrier lifetime values shorter than an average carrier lifetime of minority carriers of the semiconductor substrate, in the semiconductor substrate. The method further includes a grinding step of grinding a second principal surface of the semiconductor substrate, and an implanting step of implanting an impurity of the first conductivity type into the ground second principal surface of the semiconductor substrate. The method further includes a second irradiating step of irradiating the ground second principal surface implanted with the impurity of the first conductivity type, with a laser beam to electrically activate the implanted impurity.

Here also, the method can include an intermediate irradiating step of irradiating the ground second principal surface with hydrogen ions before the implanting step. The second irradiating step electrically activates the hydrogen ions irradiated in the intermediate irradiating step and the impurity of the first conductivity implanted on the implanting step.

In both method aspects, the first irradiating step can include irradiating the first principal step with the hydrogen ions whose dose quantity is in a range of $5 \times 10^{11}$ to $5 \times 10^{12}$ atoms/cm$^2$, both inclusively. The second irradiating step can irradiate the hydrogen ions at an acceleration voltage of 300 keV to 1 MeV, both inclusively.

BRIEF DESCRIPTION OF THE DRAWINGS

FIG. 1 schematically illustrates the cross-sectional configuration, net doping concentration, and lifetime distribution of a first embodiment of a semiconductor device according to the present invention.

DETAILED DESCRIPTION

Figure 2A:
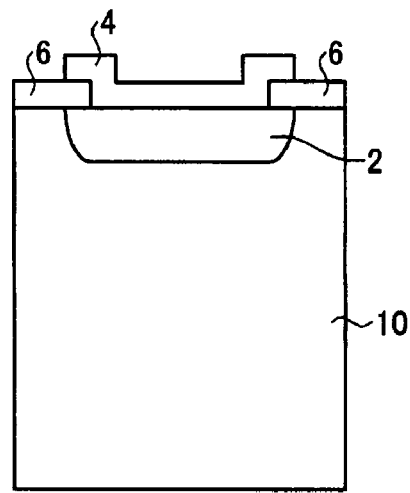
FIG. 2A-2F schematically illustrate a first method of producing the semiconductor device of FIG. 1.

Preferred embodiments of the semiconductor device and the producing method thereof are described below in detail with reference to the accompanying drawings. In the present disclosure, a layer or a region prefixed with N or P means that electrons or holes are majority carriers therein, respectively. Moreover, a superscript "+" or "−" appearing next to N or P indicates that the impurity concentration is relatively high or low, respectively. In the following description of the embodiments and all the accompanying drawings, the same elements and configurations are marked with the same reference characters.

Referring to FIG. 1, a semiconductor device 100 (first embodiment) has a second semiconductor layer 2 of a P type serving as a P anode layer formed on one principal surface of a first semiconductor layer 1 (i.e., semiconductor substrate) of an N type serving as an N$^-$ drift layer. A third semiconductor layer 3 of the N type serving as an N$^+$ cathode layer is formed on the other principal surface of the first semiconductor layer 1. An anode electrode 4 is formed on a surface of the second semiconductor layer 2. A cathode electrode 5 is formed on a surface of the third semiconductor layer 3.

As shown in a characteristic graph 110 of distance from the anode electrode versus net doping concentration (log) in FIG. 1, the net doping concentration of the first semiconductor layer 1 has a peak near its midpoint and decreases with a gradient toward the second and third semiconductor layers 2 and 3. That is, in the first embodiment, the semiconductor device 100 has a broad buffer structure. The net doping concentrations of the second and third semiconductors 2 and 3 are both higher than the net doping concentration of the first semiconductor layer 1.

As shown in a characteristic graph 120 of distance from the anode electrode versus lifetime in FIG. 1, the lifetime in a region extending from the interface between the first and second semiconductor layers 1 and 2 to the position X1 of a cathode-side end portion of the broad buffer structure is shorter than the lifetime in a region extending from the position X1 to the interface between the first and third semiconductor layers 1 and 3. The region from the position X1 to the interface between the first and third semiconductor layers 1 and 3 is a non-killer region where the lifetime is not adjusted, namely, a region having no defect induced by heavy metal, light ion, or the like. The lifetime value in the non-killer region is not shorter than 20 μs.

The difference between the maximum lifetime value and the minimum lifetime value in the region extending from the interface between the first and second semiconductor layers 1 and 2 to the vicinity of the position X1 is not longer than 10 times. The width of the region where the broad buffer structure is formed is about 10%-20% of the width of the first semiconductor layer 1 when the first semiconductor layer 1 is fully depleted. When the difference between the maximum lifetime value and the minimum lifetime value only in the region of the broad buffer structure is not longer than 10 times, the average lifetime change in the first semiconductor layer 1 is about 1%-2%, which exhibits substantially uniform lifetime values. Accordingly, it can be said that the lifetime values in the range extending from the interface between the first and second semiconductor layers 1 and 2 to the vicinity of the position X1 are substantially uniform. The reason why those lifetime values are obtained is that the carbon concentration of the position where the impurity concentration of the first semiconductor layer is locally maximized is in a range of $6.0 \times 10^{15}$ to $2.0 \times 10^{17}$ atoms/cm$^3$, both inclusively. The reason why the carbon concentration is in this range is described later.

The net doping concentration and size of each part when the semiconductor device of the first embodiment was produced with a 1200V withstand voltage class and a rating current of 150 A are shown as an example. The size is based on the interface between the second semiconductor layer 2 and the anode electrode 4 and expressed in distance from this interface except as otherwise noted.

The distance to the interface between the second semiconductor layer 2 and the first semiconductor layer 1 can be 3 μm. The distance to the interface between the third semiconductor layer 3 and the cathode electrode 5 can be 120 μm. The distance from the interface between the first and third semiconductor layers 1 and 3 to the interface between the third semiconductor layer 3 and the cathode electrode 5, i.e., the thickness of the third semiconductor layer 3, can be 0.5 μm.

The net doping concentration of the second semiconductor layer 2 can be $5 \times 10^{16}$ atoms/cc at the interface between the second semiconductor layer 2 and the anode electrode 4, can decrease toward the first semiconductor layer 1, and can be a value lower than $3 \times 10^{13}$ atoms/cc at the interface between the second semiconductor layer 2 and the first semiconductor layer 1. The net doping concentration of the first semiconductor layer 1 can be a value lower than $3 \times 10^{13}$ atoms/cc at the interface between the first and second semiconductor layers 1 and 2, but can be $3 \times 10^{13}$ atoms/cc at a position near the interface between the first and second semiconductor layers 1 and 2. Although either atoms/cc or atoms/cm$^3$ is used as a unit of concentration in the following description, "cc" and "cm$^3$" are equivalent to each other.

The net doping concentration of the first semiconductor layer 1 can have a peak value of $2.5 \times 10^{14}$ atoms/cc at a position substantially near its midpoint. The net doping concentration of the first semiconductor layer 1 can be $3 \times 10^{13}$ atoms/cc at the interface between the first and third semiconductor layers 1 and 3 and its vicinity. The net doping concentration of the third semiconductor layer 3 can be $3 \times 10^{13}$ atoms/cc at the interface between the first and third semiconductor layers 1 and 3, can increase toward the cathode electrode 5, and can be $1 \times 10^{19}$ atoms/cc at the interface between the third semiconductor layer 3 and the cathode electrode 5.

The distance to the position where the net doping concentration of the first semiconductor layer 1 is at the peak can be 50 μm. This distance is equal to the projected range Rp of protons when a surface of the second semiconductor layer 2 is irradiated with protons at a production stage. The proton concentration becomes high in the vicinity of the projected range Rp of protons. The distance to the position X1 can be about 70 μm. The lifetime can have a value of 0.1 μs in a region extending from the interface between the first and second semiconductor layers 1 and 2 to the vicinity of the position X1 and can increase in the vicinity of the position X1. The lifetime value in the non-killer region can be 20 μs.

According to the first embodiment, the lifetime in the region extending from the interface (PN function surface) between the second and first semiconductor layers to the anode-side end portion of the broad buffer structure, that is, in the region irradiated with protons, can be reduced uniformly.

The method of producing the semiconductor device (first embodiment) follows. Manufacturing the semiconductor device (withstand voltage: 1200V class, rating current: 150 A) having the size and net doping concentration shown in FIG. 1 is described as an example. First, as shown in FIG. 2A, an FZ wafer 10 having a specific resistance of 90 to 300 Ωcm, e.g. 150 Ωcm (with a phosphorus concentration of $3.0 \times 10^{13}$ atoms/cm$^3$), can be used as a semiconductor substrate. The carbon concentration of the position of the FZ wafer 10 where the impurity concentration will be locally maximized is in a range of $6.0 \times 10^{15}$ to $2.0 \times 10^{17}$ atoms/cm$^3$, both inclusively. In the following description, the concentration of the semiconductor substrate per se is referred to as bulk concentration. Then, a second semiconductor layer 2 as a P anode layer, a guard ring edge structure (not shown), an insulating film 6, and an anode electrode 4 are formed by a standard diode forming process. For example, the second semiconductor layer 2 can exhibit a concentration of $1 \times 10^{16}$ atoms/cm$^3$ at a depth of 3 μm. For example, the material of the anode electrode 4 can be AlSi1%.

Figure 2B:
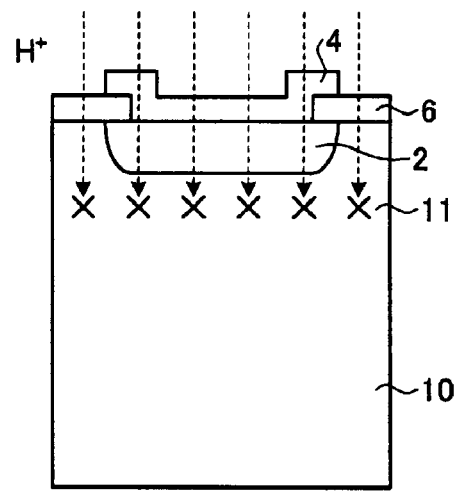

Then, as shown in FIG. 2B, a surface of the FZ wafer 10 on the side of the anode electrode 4 is irradiated with protons accelerated by a cyclotron. On this occasion, the acceleration voltage of the cyclotron can be, for example, 7.9 MeV, and the dose quantity of protons can be, for example, $2.0 \times 10^{12}$ atoms/cm$^2$. An aluminum absorber is used so that the thickness of the aluminum absorber is adjusted to set the projected range of protons at 50 μm from the interface between the semiconductor of the FZ wafer 10 and the anode electrode 4. In FIG. 2B, the reference character "X" refers to crystal defects 11 produced in the FZ wafer 10 irradiated with protons.

Figure 2C:
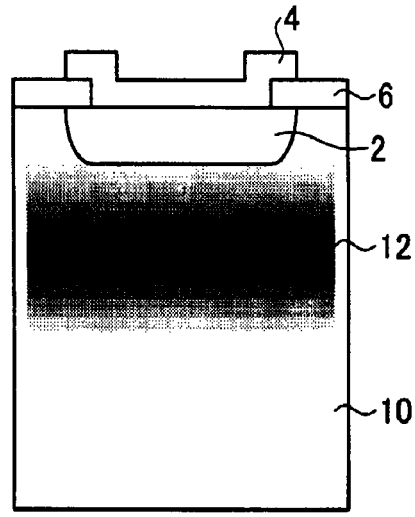

Then, heat treatment, for example, at 350° C. for 1 hour is performed in a nitrogen atmosphere to recover the crystal defects 11. Consequently, as shown in FIG. 2C, a high concentration region 12 is produced in the vicinity of a position 50 μm deep from the interface between the semiconductor of the FZ wafer 10 and the anode electrode 4. A desired broad buffer structure is made of the high concentration region 12.

Figure 2D:
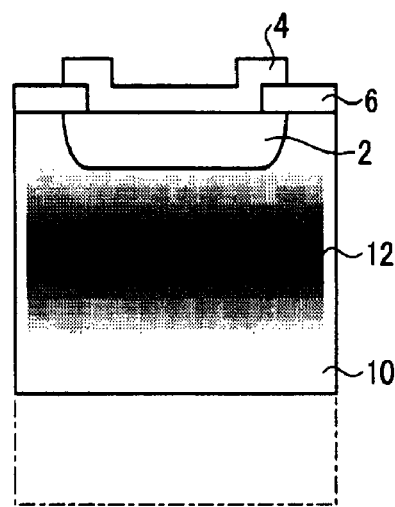

Then, as shown in FIG. 2D, a surface of the FZ wafer 10 opposite to the surface where the anode electrode 4 is formed is ground or wet-etched so that the FZ wafer 10 has a predetermined thickness. For the 1200V withstand voltage class, the thickness of the FZ wafer 10 in this stage can be typically 100-160 μm. In the first embodiment, the thickness of the FZ wafer 10 in this stage can be, for example, 120 μm.

Figure 2E:
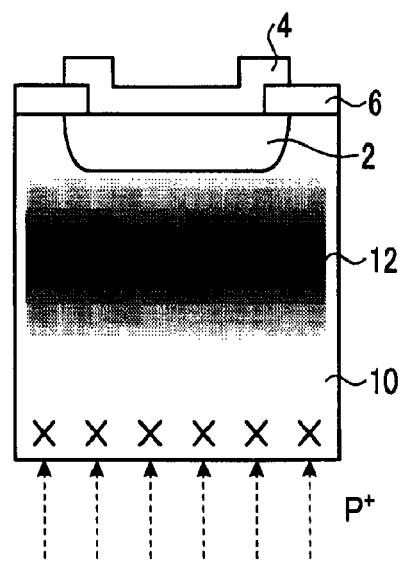

Then, as shown in FIG. 2E, an N-type impurity such as phosphorus (P) is ion-implanted into the ground or wet-etched surface of the FZ wafer 10. On this occasion, the acceleration voltage can be, for example, 50 keV, and the dose quantity can be, for example, $1 \times 10^{15}$ atoms/cm$^2$. Then, the ion-implanted surface can be irradiated with laser beams of a YAG second harmonic laser, etc., by a double pulse method, which is a method in which laser beam-irradiation areas are continuously irradiated with a plurality of pulse laser beams from a plurality of laser irradiation devices with irradiation timing staggered by predetermined delay times for each laser beam-irradiation area. The double pulse method is described in detail, for instance, in the JP-A-2005-223301.

The energy density of laser beam irradiation by the double pulse method can be, for example, 3 J/cm$^2$ in total for each laser beam-irradiation area. The double pulse delay time can be, for example, 300 nsec. The N-type impurity, such as phosphorus that was ion-implanted before laser beam irradiation, is electrically activated by the laser beam irradiation so that a third semiconductor layer serving as an N$^+$ cathode layer is formed.

Figure 2F:
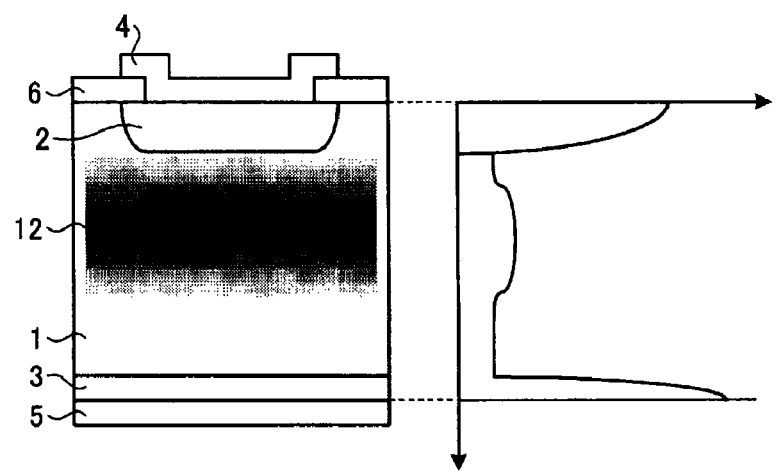

Finally, as shown in FIG. 2F, films of titanium, nickel, and gold can be formed successively on the surface of the third semiconductor layer 3 to thereby form a cathode electrode 5, which is in ohmic contact with the third semiconductor layer 3, to complete the semiconductor device (diode). The region of the FZ wafer 10 between the second and third semiconductor layers 2 and 3 serves as the first semiconductor layer 1. A characteristic graph in FIG. 2F shows a net doping concentration profile corresponding to the sections of the semiconductor device in FIG. 2-6.

Figure 3A:
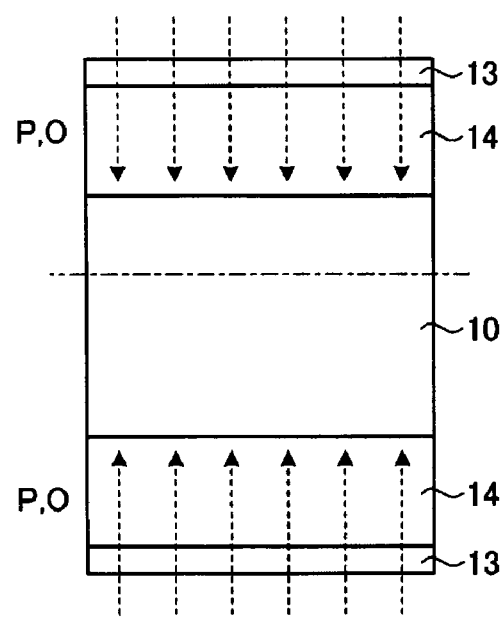
FIG. 3A-3H schematically illustrate a second method of producing the semiconductor device of FIG. 1.

FIGS. 3A-3H illustrate another method. First, as shown in FIG. 3A, opposite surfaces of an FZ wafer 10 are coated with phosphorus glass 13 and heat-treated in a nitrogen and oxygen atmosphere, for example, at 1300° C. for 10 hours so that phosphorus is diffused from the opposite surfaces. A large quantity of oxygen (O) is imported into the FZ wafer 10 from its opposite surfaces by the heat treatment, so that the oxygen concentration of the FZ wafer 10 reaches a solid solution limiting concentration (about $1 \times 10^{18}$ atoms/cm$^3$).

Figure 3B:
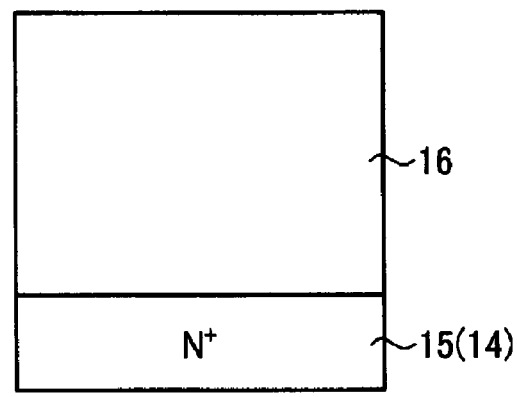
Figure 3C:
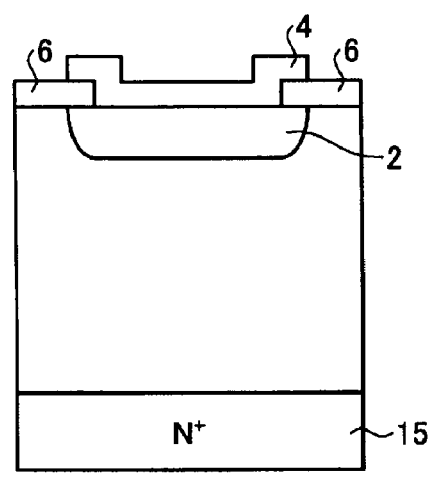

As represented by a one-dot chain line in FIG. 3A, the FZ wafer 10 is ground from its front surface so that a high-concentration phosphorus diffusion layer 14 on the front surface side of the wafer is removed. Consequently, as shown in FIG. 3B, an FZ wafer 16 having a third semiconductor layer 15 made of a high-concentration phosphorus diffusion layer 14 is obtained. The ground one surface (front surface) of the FZ wafer 16 is mirror-polished. The other surface (rear surface) of the thin FZ wafer 16 has a surface concentration of about $1 \times 10^{20}$ atoms/cm$^3$, and phosphorus of a high concentration is diffused, for example, down to a depth of 80 µm. At this point, the total thickness of the wafer is about 500 µm. Then, as shown in FIG. 3C, the FZ wafer 16 having the phosphorus diffusion layer 14 formed in its rear surface is used so that a second semiconductor layer 2 serving as a P anode layer, a guard ring edge structure (not shown), an insulating film 6, and an anode electrode 4 are formed by a standard diode forming process.

Figure 3D:
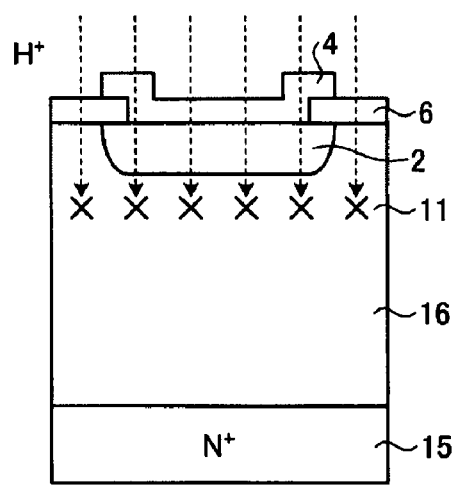

Then, as shown in FIG. 3D, the surface of the FZ wafer 16 on the side of the anode electrode 4 is irradiated with protons accelerated by a cyclotron. On this occasion, the acceleration voltage of the cyclotron can be, for example, 7.9 MeV, and the dose quantity of protons can be, for example, $2.0 \times 10^{12}$ atoms/cm$^2$. An aluminum absorber is used so that the thickness of the aluminum absorber is adjusted to set the projected range of protons at 50 µm from the interface between the semiconductor of the FZ wafer 16 and the anode electrode 4. In FIG. 3D, the reference character "X" refers to crystal defects 11 produced in the FZ wafer 16 irradiated with protons.

Figure 3E:
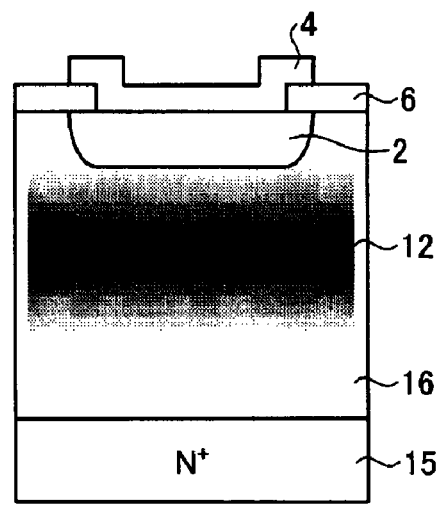

Then, heat treatment, for example, at 350° C. for 1 hour is performed in a nitrogen atmosphere to recover the crystal defects 11. Consequently, as shown in FIG. 3E, a high concentration region 12 is produced in the vicinity of a position 50 µm deep from the interface between the semiconductor of the FZ wafer 16 and the anode electrode 4. A desired broad buffer structure is made of the high concentration region 12.

Figure 3F:
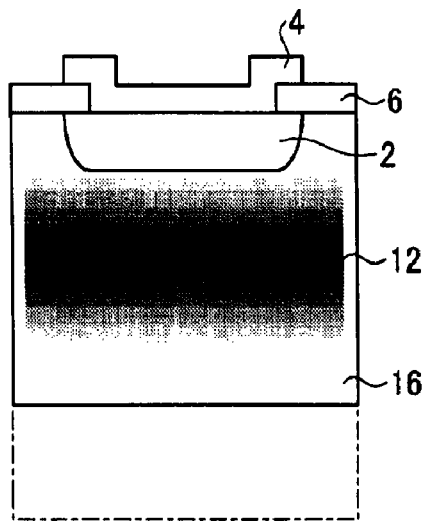

Then, as shown in FIG. 3F, the surface of the FZ wafer 16 opposite to the surface where the anode electrode 4 is formed can be ground or wet-etched so that the FZ wafer 16 has a predetermined thickness. For the 1200V withstand voltage class, the thickness of the FZ wafer 16 in this stage can be typically 100-160 µm. In the first embodiment, the thickness of the FZ wafer 16 in this stage can be, for example, 120 µm.

Figure 3G:
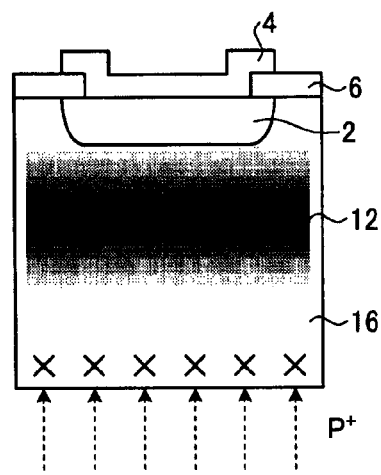

Then, as shown in FIG. 3G, an N-type impurity, such as phosphorus (P), is ion-implanted into the ground or wet-etched surface of the FZ wafer 16. On this occasion, the acceleration voltage can be, for example, 50 keV, and the dose quantity can be, for example, $1 \times 10^{15}$ atoms/cm$^2$. Then, the ion-implanted surface can be irradiated with laser beams of a YAG second harmonic laser, etc., by the double pulse method previously described.

The energy density of laser beam irradiation by the double pulse method can be, for example, 3 J/cm$^2$ in total for each laser beam-irradiation area. The double pulse delay time can be, for example, 300 nsec. The N-type impurity such as phosphorus that was ion-implanted before laser beam irradiation can be electrically activated by the laser beam irradiation so that a third semiconductor layer serving as an N$^+$ cathode layer is formed.

Figure 3H:
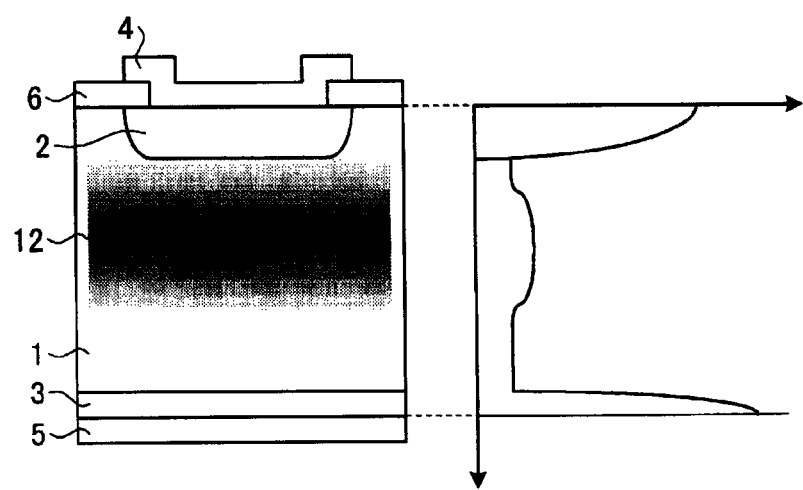

Finally, as shown in FIG. 3H, metal films of titanium, nickel, and gold can be formed successively on the surface of the third semiconductor layer 3 to thereby form a cathode electrode 5, which is in ohmic contact with the third semiconductor layer 3, to complete the semiconductor device (diode). The region of the FZ wafer 16 between the second and third semiconductor layers 2 and 3 serves as the first semiconductor layer 1. A characteristic graph in FIG. 3H shows a net doping concentration profile corresponding to the sections of the semiconductor device.

When the FZ wafer having the high-concentration phosphorus diffusion layer formed in its rear surface as described above is used, the high-concentration phosphorus diffusion layer serves as a layer for gettering an impurity, such as heavy metal, in the producing process as disclosed in Patent Document 2. Moreover, lowering of carrier mobility caused by proton irradiation is suppressed because the wafer contains oxygen.

Lithium ions, oxygen ions, etc., can be used as ions for irradiating the wafer to form N-type donors. Lithium ions, oxygen ions, etc., are, however, heavier in mass than protons so that a sufficiently wide projected range Rp cannot be obtained. Accordingly, protons are preferred as ions for irradiating the wafer.

Figure 4:
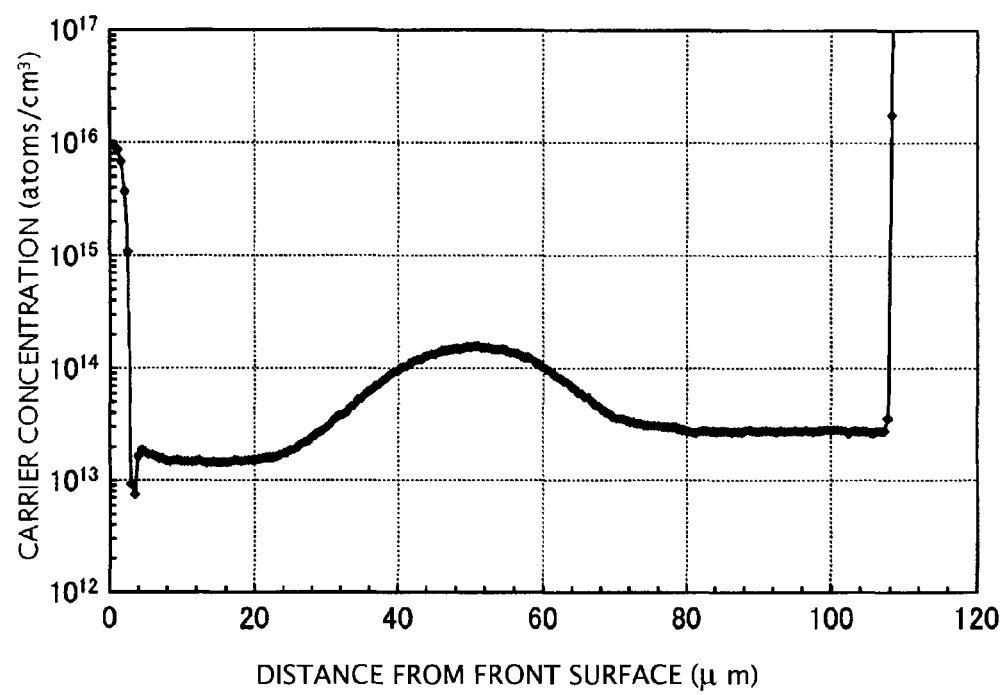
FIG. 4 is a graph illustrating the relationship between the carrier concentration and the distance from the front surface (surface irradiated with protons).

Next, a sample produced according to the above method was attached to a mount at an angle of 5° 44' and polished with a ¹⁄₂₀ diamond compound so that a section of a wafer was exposed. SSM2000 made by Solid State Measurement, Inc. was used for measuring the spreading resistance of the sample. FIG. 4 shows the result of the conversion of the resistance value obtained by the measurement into a carrier concentration. In FIG. 4, the vertical axis shows the carrier concentration and the horizontal axis shows the distance from the wafer surface (proton-irradiated surface). The distance from the proton-irradiated surface is hereinafter regarded as a depth except as otherwise noted.

In FIG. 4, measurement was performed after one and the same sample was cleft to prepare a sample to be measured from the front surface and a sample to be measured from the rear surface. As for the obtained results, data are plotted so that peak positions in each data of the carrier concentration of the broad buffer structure are superposed on each other. As shown in FIG. 4, the carrier concentration has a peak at a position about 50 μm deep. The concentration of the anode-side region relative to the broad buffer structure in the first semiconductor layer is lower than the bulk concentration because the anode-side region of the first semiconductor layer is a region penetrated by protons. For this reason, lowering of carrier mobility is caused by lattice defects, such as dislocation formed at the time of proton penetration, so that the value of resistance is reduced in accordance with the lowering of carrier mobility. Accordingly, the concentration of the anode-side region relative to the broad buffer structure in the first semiconductor layer is lower than bulk concentration. In addition, there are many lattice defects in the region. Therefore, the concentration relation is preferable. When the FZ wafer is irradiated with protons from the anode electrode side and annealed, a broad buffer structure having a higher concentration than the bulk concentration can be formed.

Figure 5:
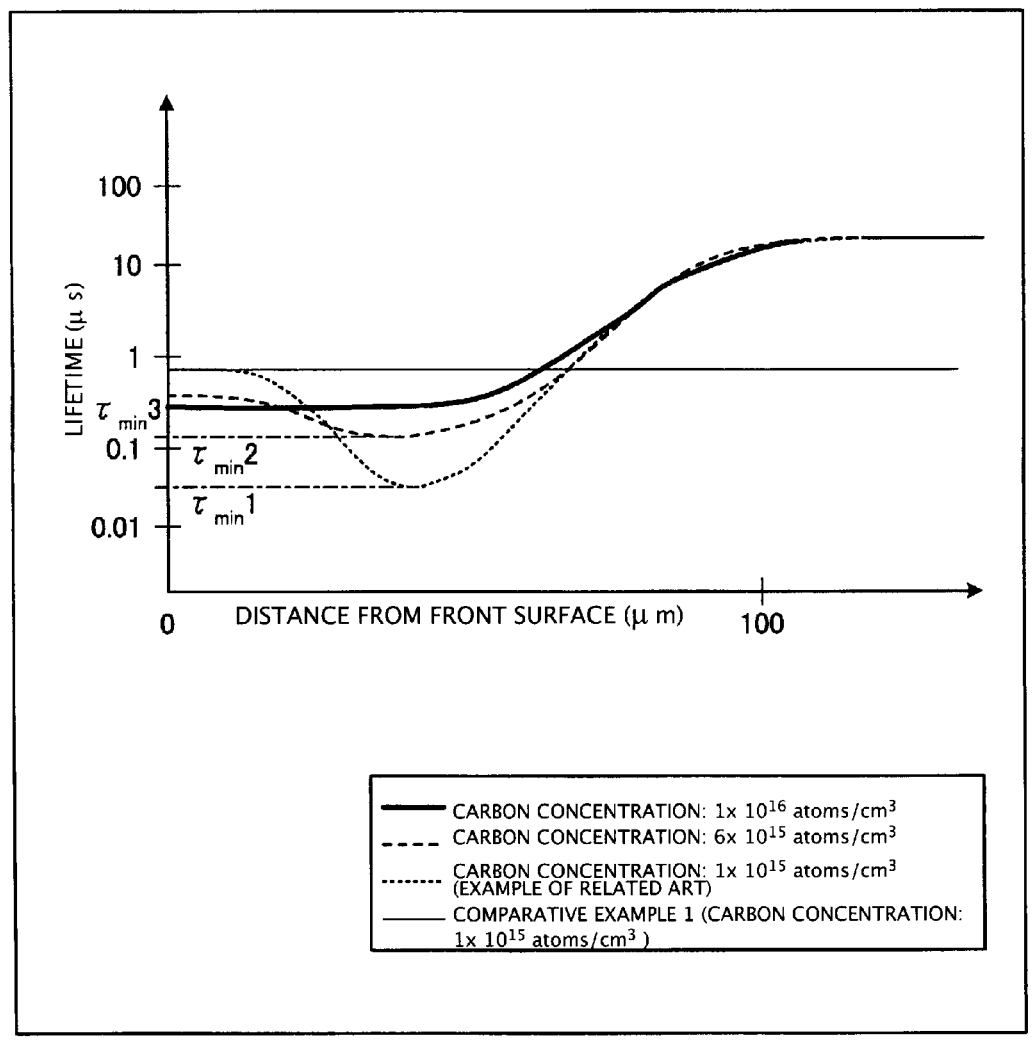
FIG. 5 is a graph illustrating the relationship between the carbon concentration of silicon crystal, the lifetime, and the distance from the front surface.

Next, the reason why the lifetime in the region extending from the PN junction surface to the cathode-side end portion of the broad buffer structure is shortened uniformly is described. FIG. 5 is a graph showing the relationship between the carbon concentration of silicon crystal, the lifetime, and the distance from the front surface (proton-irradiated surface). In FIG. 5, there is shown a lifetime value distribution of minority carriers when a front surface of an n-type FZ wafer was irradiated with protons to form a projected range Rp of 50 μm at an acceleration voltage of 7.9 MeV, and annealed in a nitrogen atmosphere at 350° C. for 1 hour. In FIG. 5, the vertical axis expresses the lifetime and the horizontal axis expresses the distance from the front surface. In FIG. 5, measurement was performed at carbon concentrations of from $1\times10^{15}$ to $1\times10^{16}$ atoms/cm$^3$. As shown in FIG. 5, the lifetime distribution in the region up to 50 μm as the distance from the front surface becomes flatter as the carbon concentration of silicon crystal increases. It is found that the lifetime distribution in a region up to 50 μm as the distance from the front surface becomes uniform when the carbon concentration is $1\times10^{16}$ atoms/cm$^3$.

Figure 6:
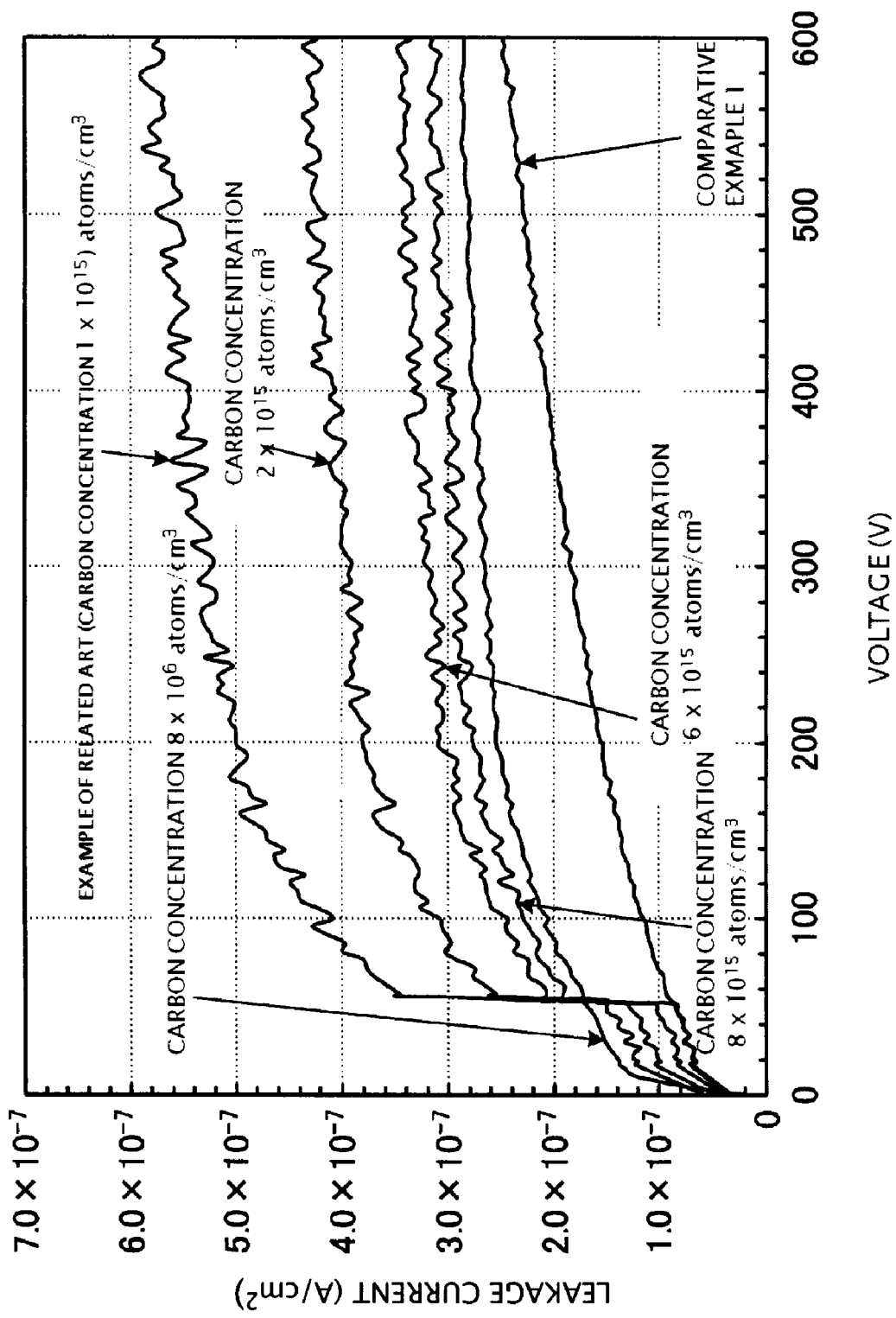
FIG. 6 is a graph illustrating the relationship between the carbon concentration of silicon crystal, the leakage current, and the voltage.

FIG. 6 is a graph showing the relationship between the carbon concentration of silicon crystal, the leakage current, and the voltage. In FIG. 6, the vertical axis expresses the leakage current and the horizontal axis expresses the voltage. In FIG. 6, measurement was performed at carbon concentrations of from $1\times10^{15}$ to $1\times10^{16}$ atoms/cm$^3$. As shown in FIG. 6, the kinked waveform is suppressed as the carbon concentration increases. It is found that the kinked waveform is eliminated when the carbon concentration is $1\times10^{16}$ atoms/cm$^3$.

Carbon in crystal varies according to a producing method for crystal pulling. According to "Ultra LSI Process Data Handbook" (published by Science Forum, 1982), there has been described the fact that carbon is mixed by a crucible used in a CZ method for holding melted silicon. On the other hand, there is no crucible used in an FZ method, but carbon contained in polycrystalline silicon as a raw material or CZ silicon crystal used recently remains.

The carbon concentration of the FZ wafer is generally not higher than $1.0\times10^{15}$ atoms/cm$^3$ and below the limit of detection by an analytical instrument such as an FTIR (Fourier Transform Infrared Spectrophotometer) or an SIMS (Secondary Ion Mass Spectrometry). This is because the FZ pulling method performs production by pulling up silicon crystal from high purity polycrystalline silicon with a purity of 99.9999999% or higher. For example, the carbon concentration of such silicon crystal can be controlled by a method disclosed in JP-A-2006-69852.

Incidentally, in FIG. 5 or 6, the carbon concentration of silicon crystal was detected by activation analysis or infrared analysis. Alternatively, the SIMS can be used for detecting the carbon concentration of a position several μm deep from the front surface. In any method, the carbon concentration up to about $5.0\times10^{14}$ atoms/cm$^3$ can be detected. In FIGS. 5 and 6, a semiconductor device produced in the manner that an FZ wafer of silicon crystal containing a carbon concentration of not higher than $1.0\times10^{15}$ atoms/cm$^3$ was irradiated with protons is shown as a semiconductor device according to the related art, and a semiconductor device produced in such a manner that the FZ wafer was irradiated with an electron beam at a dose quantity of 180 kGy is shown as Comparative Example 1. Incidentally, in the following description, the semiconductor device produced by irradiation with an electron beam according to the related art is regarded as Comparative Example 1, and a semiconductor device produced by irradiation with helium ions is regarded as Comparative Example 2.

According to the aforementioned expression (1), the leakage current is decided by the minimum lifetime ($\tau_{min}1$ to $\tau_{min}3$) shown in FIG. 5. The minimum lifetime $\tau_{min}1$ in the related art is about 30 ns and shorter than the minimum lifetime (about 600 ns) in Comparative Example 1. As shown in FIG. 6, when the applied voltage is not higher than 50V, the leakage current of the semiconductor device according to the related art is substantially equal to that of Comparative Example 1 (i.e., exhibits a sufficiently low value). When the applied voltage becomes higher than 50V, the leakage current increases suddenly and forms a kinked waveform. When the voltage is not lower than 100V, the leakage current becomes the highest in comparison with other examples different in carbon concentration shown in FIG. 6.

The reason why the leakage current forms such a kinked waveform is that the minimum lifetime $\tau_{min}1$ in the related art is shorter in comparison with other examples different in carbon concentration as shown in FIG. 5. In this case, a lifetime value of about 600 ns is exhibited near the wafer surface and a lifetime value of about 30 ns is exhibited near the projected range.

In this manner, when the depletion layer reaches the broad buffer structure, that is, the vicinity of the projected range, the defect concentration distribution of the vicinity of the projected range becomes higher suddenly than that of the vicinity of the wafer surface. As a result, the lifetime is minimized in the vicinity of the projected range. Accordingly, since the leakage current increases as the lifetime decreases in accordance with the aforementioned expression (1), the leakage current is maximized in the vicinity of the projected range. For this reason, a kinked waveform occurs.

On the other hand, as shown in FIG. 6, when the carbon concentration is increased to $2\times10^{15}$, $6\times10^{15}$ and $8\times10^{15}$ atoms/cm$^3$ successively, the kinked waveform is suppressed, and the leakage current at a voltage of 100V or higher is reduced. When the carbon concentration is $1\times10^{16}$ atoms/cm$^3$, the kinked waveform is eliminated perfectly. It is conceived that this is because carbon atoms fulfill more intensively a function of terminating defects locally concentrated in the vicinity of the projected range of protons as the contained carbon concentration increases.

For this reason, as shown in FIG. 5, the lifetime value in the vicinity of the wafer surface at the carbon concentration of $6\times10^{15}$ atoms/cm$^3$ becomes shorter than that at the carbon concentration of $1\times10^{15}$ atoms/cm$^3$, and the lifetime value in the vicinity of the projected range at the carbon concentration of $6\times10^{15}$ atoms/cm$^3$ becomes longer than that at the carbon concentration of $1\times10^{15}$ atoms/cm$^3$. Accordingly, as shown in FIG. 6, the leakage current at a voltage of 50V or lower at the carbon concentration of $6\times10^{15}$ atoms/cm$^3$ becomes larger than that at the carbon concentration of $1\times10^{15}$ atoms/cm$^3$, and the leakage current at a voltage of 50V or higher at the carbon concentration of $6\times10^{15}$ atoms/cm$^3$ becomes smaller than that at the carbon concentration of $1\times10^{15}$ atoms/cm$^3$.

As shown in FIG. 5, when the carbon concentration is $1\times10^{16}$ atoms/cm$^3$, the lifetime values in a region extending from the wafer surface to the vicinity of the projected range are substantially uniform, that is, about 300 ns. The lifetime value at the carbon concentration of $1\times10^{16}$ atoms/cm$^3$ is shorter in comparison with the lifetime value (about 600 ns) of the semiconductor device according to the related art. This indicates that lattice defects per se have been not recovered yet and the carrier lifetime is kept at a sufficiently shorter value. For this reason, as shown in FIG. 5, the concentration of carriers stored in the irradiated region is reduced uniformly, so that soft recovery can be exhibited even when the loss is sufficiently low.

In this manner, adjustment of the carbon concentration of wafer crystal permits the lifetime distribution to be substantially uniform in the proton penetration region and the region near the projected range Rp when proton irradiation is performed from the anode side surface. Moreover, increasing the minimum lifetime value permits suppression of the kinked waveform and reduction of the leakage current.

Incidentally, solid solubility of carbon atoms in silicon at a melting point (1414° C.) is about $3.2\times10^{17}$ atoms/cm$^3$. On the other hand, when the carbon concentration is not lower than $1.0\times10^{17}$ atoms/cm$^3$, which is near the solid solubility, the leakage current caused by dislocation increases. It is therefore preferable that the carbon concentration be not higher than $2.0\times10^{17}$ atoms/cm$^3$, more preferably not higher than $1.0\times10^{17}$ atoms/cm$^3$.

A method of forming local defects, a high concentration layer, and a lifetime shortening region by controlling carbon and helium has been disclosed in JP-A-2006-352101. However, there is no description about the relationship between the actual leakage current and the carbon concentration described in the present disclosure. The method disclosed in JP-A-2006-352101 is a method not for making the lifetime uniform but for locally concentrating defects. Accordingly, the method disclosed in JP-A-2006-352101 is different from the method of controlling the lifetime uniformly in the range of the irradiated region as described herein.

The full width at half maximum is described below. In ion irradiation, the ion concentration distribution is decided by the full width at half maximum (FWHM) ($\Delta$Rp) of the projected range Rp in accordance with ion mass, acceleration voltage, and stopping power of an irradiation subject (e.g. silicon). Accordingly, damage (lattice defects) of the silicon wafer is maximized at the projected range Rp where the ion concentration is highest. For this reason, as shown in FIG. 6, when, for example, a reverse bias is statically applied to the semiconductor device according to the related art, the leakage current value increases suddenly to form a kinked waveform as soon as the depletion layer reaches the vicinity of the projected range Rp.

Figure 7:
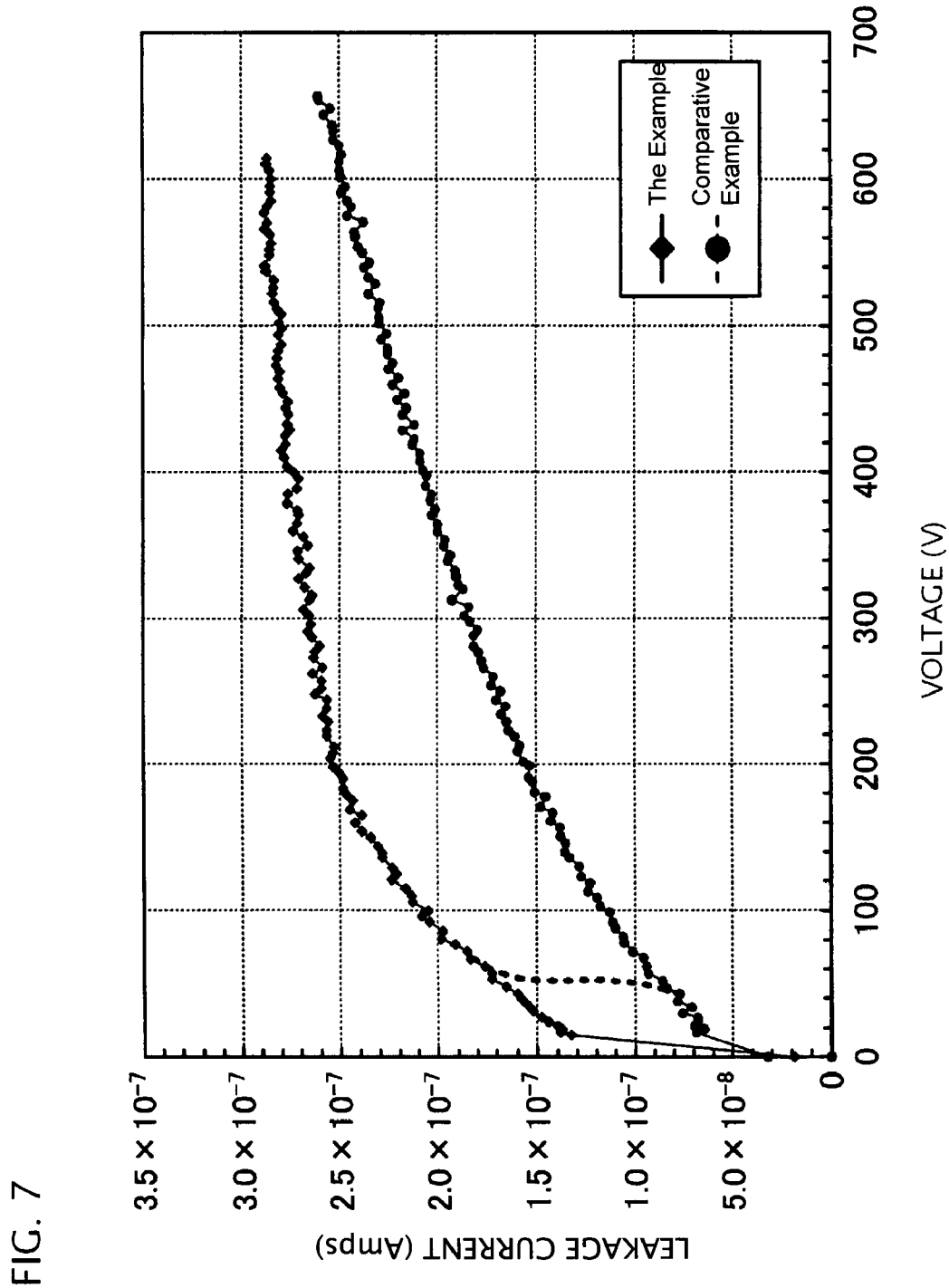
FIG. 7 is a graph illustrating the leakage current when the Example (first embodiment) and Comparative Example 1 are reverse biased.

FIG. 7 is a graph showing the leakage current when a reverse bias is applied to the first embodiment in comparison with the leakage current when a reverse bias is applied to the semiconductor device according to Comparative Example 1. Comparative Example 1 shows the semiconductor device produced by electron beam irradiation at a dose quantity of 180 kGy. The measurement temperature is room temperature (25° C.). In FIG. 7, the reference character ♦ indicates the leakage current of the first embodiment taken as the Example. In FIG. 7, the reference character ● indicates the leakage current of Comparative Example 1.

In the first embodiment (the Example), when the voltage is about 50V, the depletion layer reaches the projected range Rp (50 µm deep region). Accordingly, when the applied voltage is 50V, the leakage current can be supposed from increasing suddenly to form a kinked waveform because the leakage current is equal to or higher than the leakage current of Comparative Example 1, as shown in the broken line in FIG. 7.

In the first embodiment, however, no kinked waveform is formed as shown in FIG. 7. This is because the lifetime in the vicinity of the PN junction surface is sufficiently short and substantially uniform. That is, in the first embodiment, because heat treatment after proton irradiation neither eliminates donors caused by hydrogen nor contribute to combination, it is found that defects (point defects such as dangling bonds, etc., and dislocations as continua of point defects) remain sufficiently so that the defects will cause production of carriers and recombination. Moreover, because the lifetime in a region from the PN junction surface to the cathode side end portion of the broad buffer structure is uniformly short differently from the semiconductor device according to the related art, the carrier concentration of a region shallow in the depth of the first semiconductor layer becomes uniformly low. As a result, soft recovery can be obtained.

The width of the broad buffer structure is described below. The width of the broad buffer structure can be equal to the full width at half maximum FWHM ($\Delta$Rp) of the proton range but not smaller than 5 µm. This is because the lifetime in a region extending from the proton irradiation surface to the position X1 (see FIG. 1), which is not penetrated by protons any more, can be made substantially uniform. When the dose quantity of proton irradiation is high, the lifetime in the vicinity of the projected range Rp is shortened by affection of the defect concentration. When the FWHM ($\Delta$Rp) of the proton range is set at 5 µm or larger, the minimum lifetime value $\tau_{min}$ can be reduced to a value not longer than $\frac{1}{10}$ of the average lifetime $\tau_B$ (see FIG. 1) of the irradiated region. As a result, the lifetime in the whole irradiated region (the whole region extending from the wafer surface to the position X1) can be shortened evenly without local lifetime reduction only in the vicinity of the projected range Rp.

Figure 8:
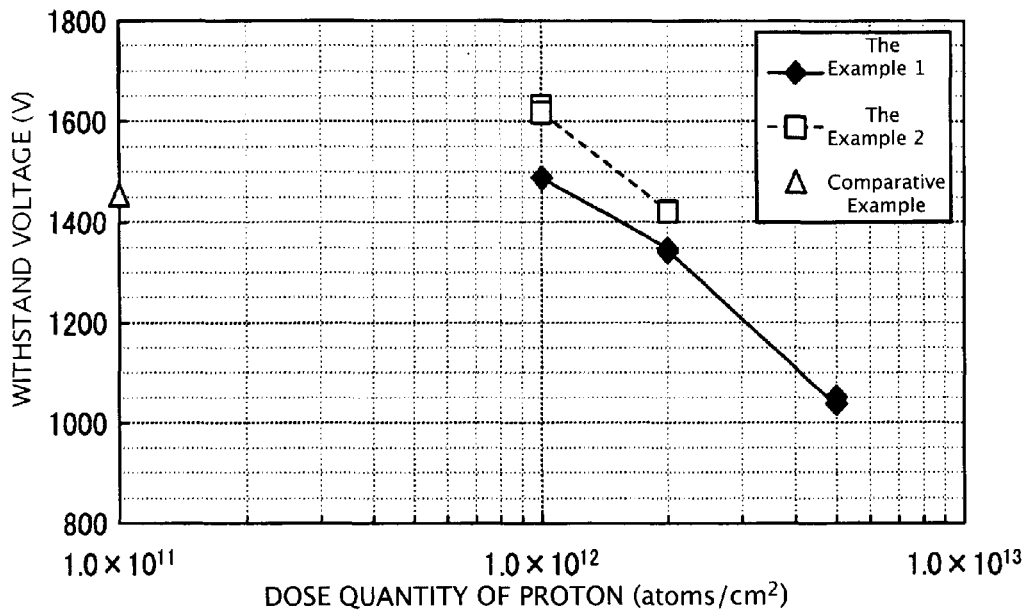
FIG. 8 is a graph illustrating the relationship between the dose quantity of protons and the withstand voltage.

The dose quantity of protons is described below. FIG. 8 is a graph showing the relationship between the dose quantity of protons and the withstand voltage. In FIG. 8, the vertical axis shows the withstand voltage and the horizontal axis shows the dose quantity of protons. In FIG. 8, the reference character ♦ indicates the dose quantity of protons and the withstand voltage in the first embodiment (the Example), and the reference character □ (Example 2) indicates the dose quantity of protons and the withstand voltage in a semiconductor device (modified first embodiment) having an N$^-$ layer about 20 µm thicker (a semiconductor device having a 140 µm-thick N$^-$ layer) than that of the first embodiment. The reference character Δ on the vertical axis indicates the withstand voltage of the semiconductor device having a specific resistance of 50 Ωcm according to Comparative Example 1.

In FIG. 8, measurement was performed at the dose quantity of protons of from $1\times10^{12}$ to $5\times10^{12}$ atoms/cm$^2$. As shown in FIG. 8, when the dose quantity of protons is $5\times10^{12}$ atoms/ cm², the withstand voltage of the semiconductor device according to the first embodiment is 1050V, which is lower than the rating voltage (1200V). When the dose quantity of protons is $5 \times 10^{12}$ atoms/cm², the withstand voltage of the semiconductor device (Example 2) having a 140 μm-thick N⁻ layer is estimated to be substantially equal to the rating voltage (1200V) on the analogy of linearity between the withstand voltage at the dose quantity of protons of $1 \times 10^{12}$ atoms/cm² and the withstand voltage at the dose quantity of protons of $2 \times 10^{12}$ atoms/cm². It is therefore preferable that the dose quantity of protons be lower than $5 \times 10^{12}$ atoms/cm².

Figure 9:
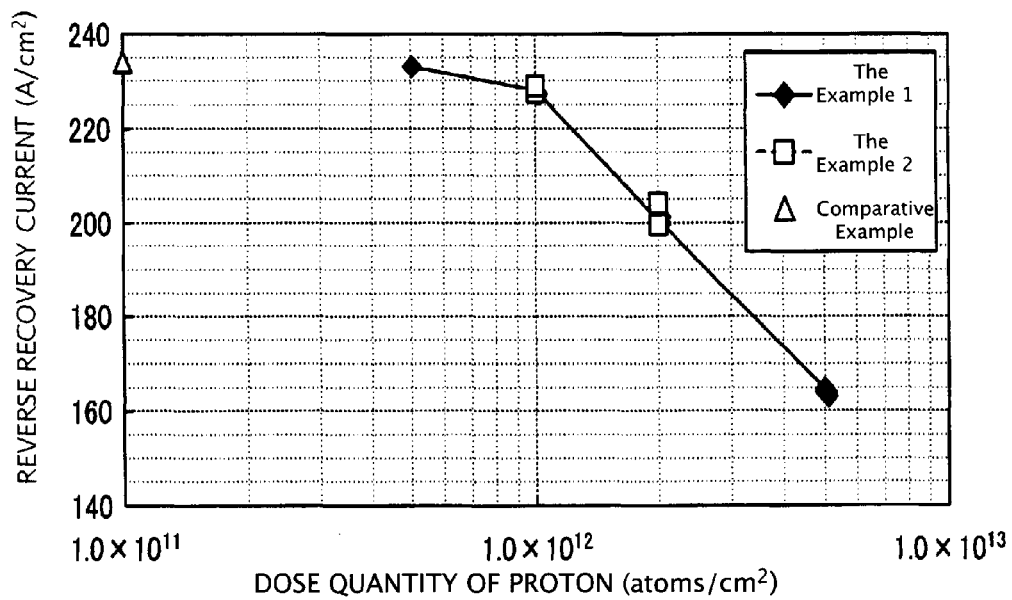
FIG. 9 is a graph illustrating the relationship between the reverse recovery current and the dose quantity of protons.

The reverse recovery peak current will be described below. FIG. 9 is a graph showing the relationship between the reverse recovery current and the dose quantity of protons. In FIG. 9, the vertical axis shows the reverse recovery current and the horizontal axis shows the dose quantity of protons. In FIG. 9, the reference character ◆ indicates the relationship between the dose quantity of protons and the reverse recovery current in the first embodiment, and the reference character □ indicates the relationship between the dose quantity of protons and the reverse recovery current in Example 2 having a 140 μm-thick N⁻ layer. The reference character Δ on the vertical axis indicates the withstand voltage of Comparative Example 1 having a specific resistance of 50 Ωcm.

As shown in FIG. 9, the reverse recovery current decreases as the dose quantity of protons increases. The reverse recovery current is substantially equal to that in Comparative Example 1 when the dose quantity of protons is $5 \times 10^{11}$ atoms/cm². Accordingly, when the dose quantity of protons is not lower than $5 \times 10^{11}$ atoms/cm², preferably not lower than $1 \times 10^{12}$ atoms/cm², it is possible to obtain a smaller waveform of the reverse recovery current than that in the related art.

As shown in FIGS. 5 and 6, the leakage current is decided by the lifetime value distribution. Moreover, the carrier concentration at the time of current conduction depends on the lifetime value distribution. Accordingly, even when, for example, the condition for proton irradiation and heat treatment varies, the lifetime values in a region extending from the wafer surface to the position X1 become uniform as long as the leakage current is constant.

Figure 10:
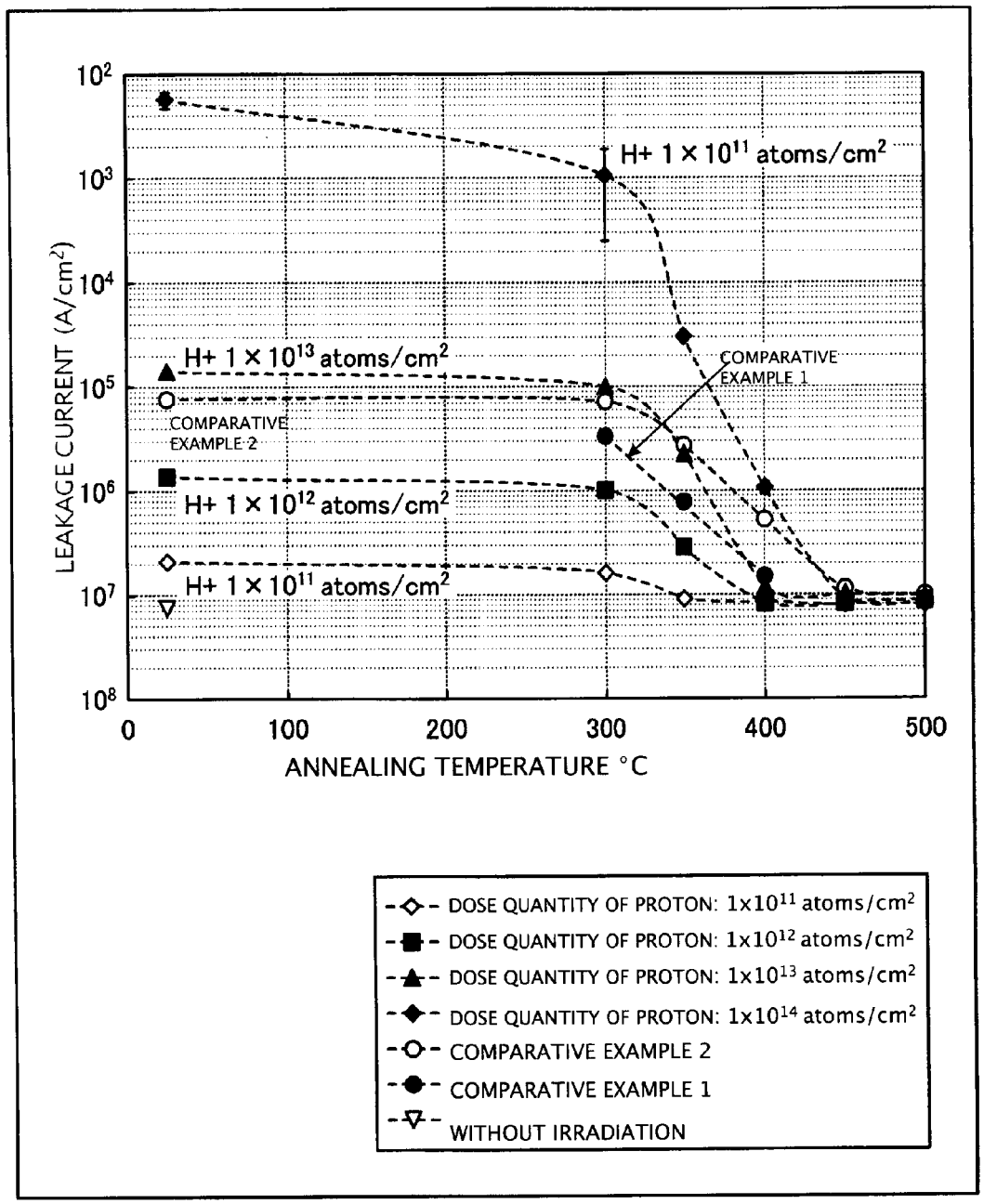
FIG. 10 is a graph illustrating the relationship between the leakage current and the annealing temperature.

FIG. 10 is a graph showing the relationship between the leakage current and the annealing temperature. In FIG. 10, the vertical axis shows the leakage current and the horizontal axis shows the annealing temperature. In FIG. 10, the leakage current when a reverse bias voltage of 60V was applied was measured at the dose quantity of protons of from $1 \times 10^{11}$ to $1 \times 10^{14}$ atoms/cm². As for other comparative examples, a semiconductor device produced by electron beam irradiation according to the related art is shown as Comparative Example 1 (the reference character ● in FIG. 10) and a semiconductor device produced by helium ion irradiation is shown as Comparative Example 2 (the reference character ○ in FIG. 10). In Comparative Example 1, electron beam irradiation was performed at an acceleration voltage of 4.8 MeV and a dose quantity of 180 kGy. In Comparative Example 2, helium ions (He²⁺) were implanted at an acceleration voltage of 24 MeV and a dose quantity of $1 \times 10^{12}$ atoms/cm² and the projected range of helium ions was adjusted to 50 μm by an aluminum absorber.

In any case, the leakage current exhibits a substantially constant value when the annealing temperature is not higher than 300° C. When the annealing temperature is from 350° C. to 400° C., the leakage current increases. When the annealing temperature reaches 450° C., the leakage current substantially converges to a value obtained without irradiation (the reference character ∇ in FIG. 10). That is, if a leakage current larger than that obtained without irradiation is obtained in a range where protons are provided as donors, the lifetime of the irradiated region is shortened at the same time that the broad buffer structure is formed. Accordingly, as shown in FIG. 10, when the annealing temperature is not higher than 300° C., the lifetime depends only on the dose quantity because the leakage current does not depend on the annealing temperature.

Figure 11:
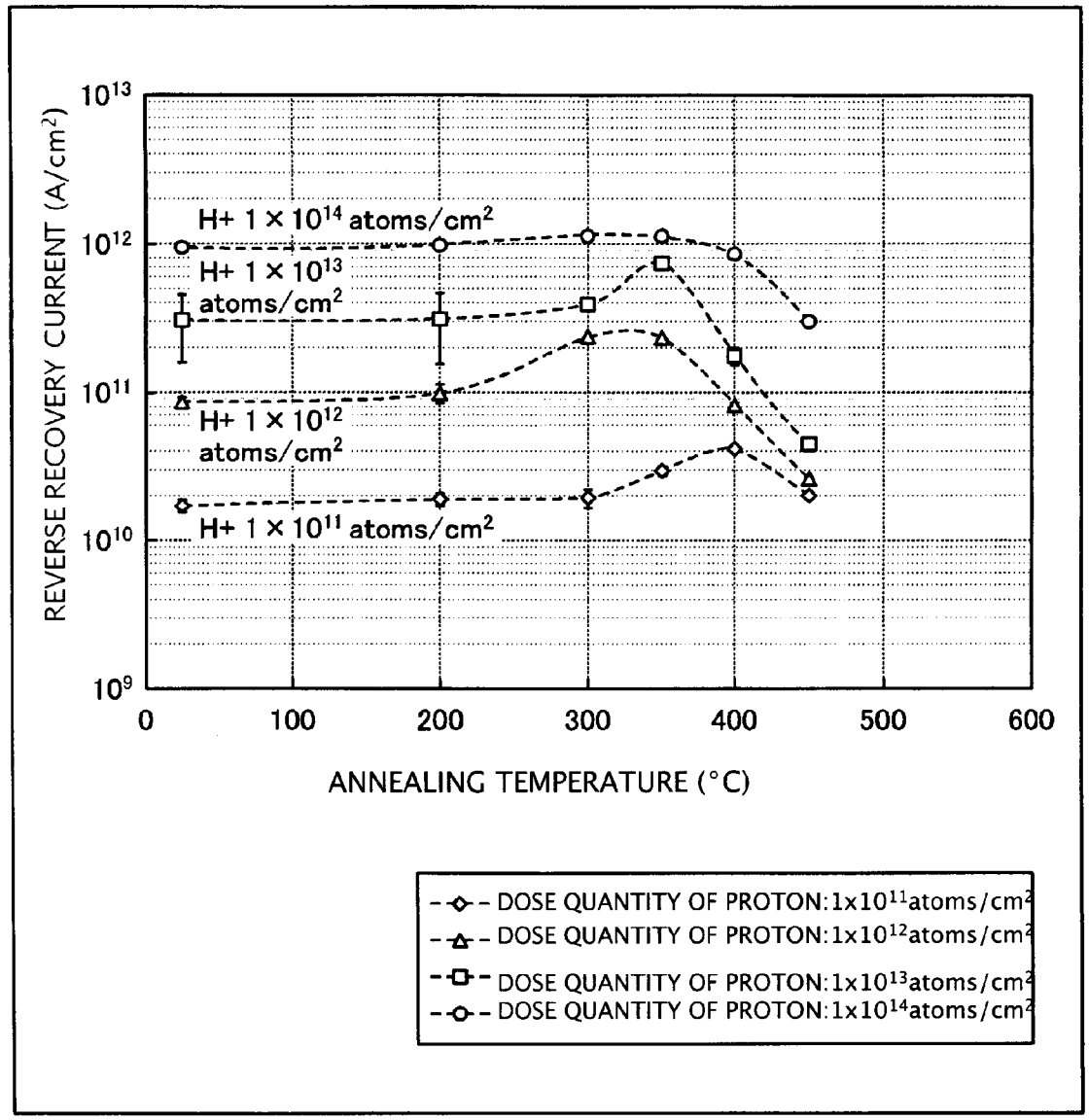
FIG. 11 is a graph illustrating the dependence of the integrated concentration NI on the annealing temperature.

On the other hand, FIG. 11 shows annealing temperature dependence of an integrated concentration NI of electrically activated hydrogen donors at each dose quantity of protons. The integrated concentration NI of hydrogen donors has influence on the withstand voltage of the broad buffer diode and the pinning effect of the space charge region spread at the time of reverse recovery as disclosed in Patent Document 2 or 3. It is therefore preferable that the integrated concentration NI be in a range of $2 \times 10^{11}$ to $5 \times 10^{11}$ atoms/cm², both inclusively. As shown in FIG. 11, when the annealing temperature is not higher than 300° C., the integrated donor concentration NI takes a substantially constant value regardless of the dose quantity of protons. It is therefore preferable that the annealing temperature be not higher than 300° C.

Figure 12:
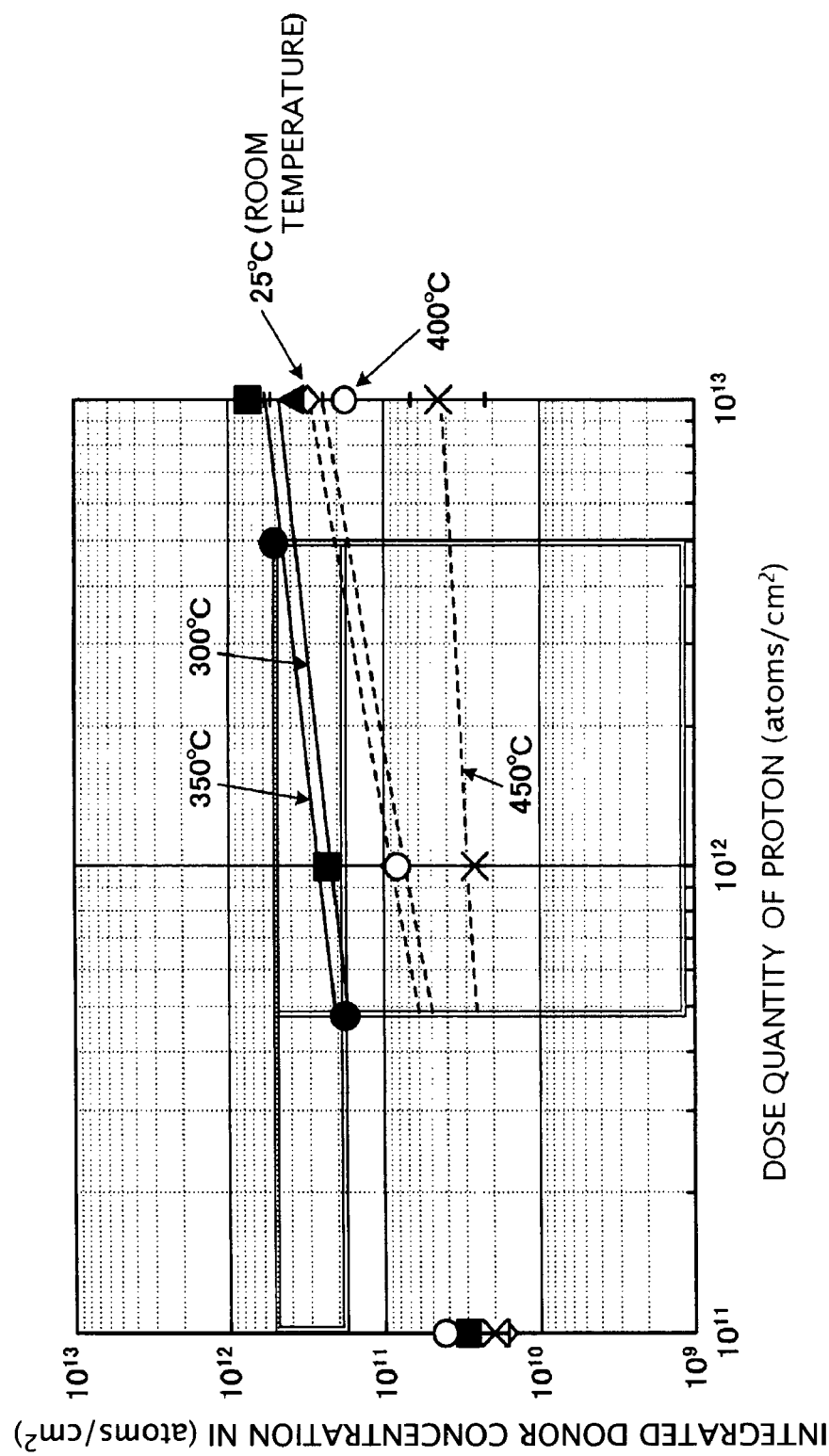
FIG. 12 is a graph illustrating the result of transforming data of FIG. 11 into the dependence of the integrated concentration NI on the dose quantity.

FIG. 12 is a graph showing a result of transformation of data of FIG. 11 into the dependence of the integrated donor concentration NI on the dose quantity. It is preferable that the integrated donor concentration NI be in an integrated concentration range of the broad buffer structure, that is, in a range of about $2 \times 10^{11}$ to $5 \times 10^{11}$ atoms/cm². It is found from FIG. 12 that the dose quantity is minimized under the condition where the integrated donor concentration NI is in this range when the temperature for heat treatment is 300° C. or 350° C. Accordingly, when the temperature for heat treatment is 300° C. or 350° C., the broad buffer structure and the short lifetime region can be simultaneously formed most effectively.

The projected range Rp of protons is described below. As described in Patent Document 2 or 3, it is preferable that the projected range Rp of protons coincides with the peak position of the broad buffer structure. This is because when a diode of a rating current density $J_F$ is reverse recovered at a DC bus voltage $V_{DC}$, which is equal to about 50%-70% of the rating voltage, the width D of the space charge region spread when the cathode-anode voltage Vka of the diode coincides with $V_{DC}$ can be substantially given by the following expression (2):

$$D = \sqrt{\frac{BV\varepsilon_s\varepsilon_o}{q\left(\frac{J_F}{qv_{sat}} + N_{dm}\right)}}, \quad (2)$$

where BV is the withstand voltage of the device, $\varepsilon_o$ is the dielectric constant of vacuum, $\varepsilon_S$ is the dielectric constant of silicon, q is the elementary electric charge, $J_F$ is the rating current density of the device, $V_{sat}$ is the saturation velocity of carriers, and $N_{dm}$ is the average concentration of the N⁻ drift layer.

When the peak position of the broad buffer structure coincides with the width D, the space charge region can be prevented from being spread to a deeper region than the peak position. For this reason, stored carriers not swept out to the space charge region remain, so that exhaustion of the stored carriers is suppressed. Accordingly, snappy recovery can be suppressed. It is actually preferable that the position of the projected range Rp be equal to about 0.5-1.6 times as large as the width D.

According to first embodiment, the lifetime distribution in the region of penetration of protons and the region near the projected range Rp in proton irradiation from the anode side surface can be made substantially uniform. Accordingly, the minimum lifetime value can be increased to suppress the kinked waveform and suppress the leakage current.

The net doping concentration, the lifetime distribution of minority carriers or the stored carrier concentration distribution in each of the semiconductor device (the Example) according to the first embodiment, the semiconductor device (Comparative Example 1) produced by electron beam irradiation according to the related art and the semiconductor device (Comparative Example 2) produced by helium ion irradiation are described below. In the following description, the projected range Rp and the full width at half maximum (FWHM: ΔRp) due to each ion irradiation are based on values calculated by SRIM2006 (http://www.srim.org/index.htm). The lifetime is adjusted so that a forward voltage drop at the current density of each semiconductor device is 1.70V.

Figure 13:
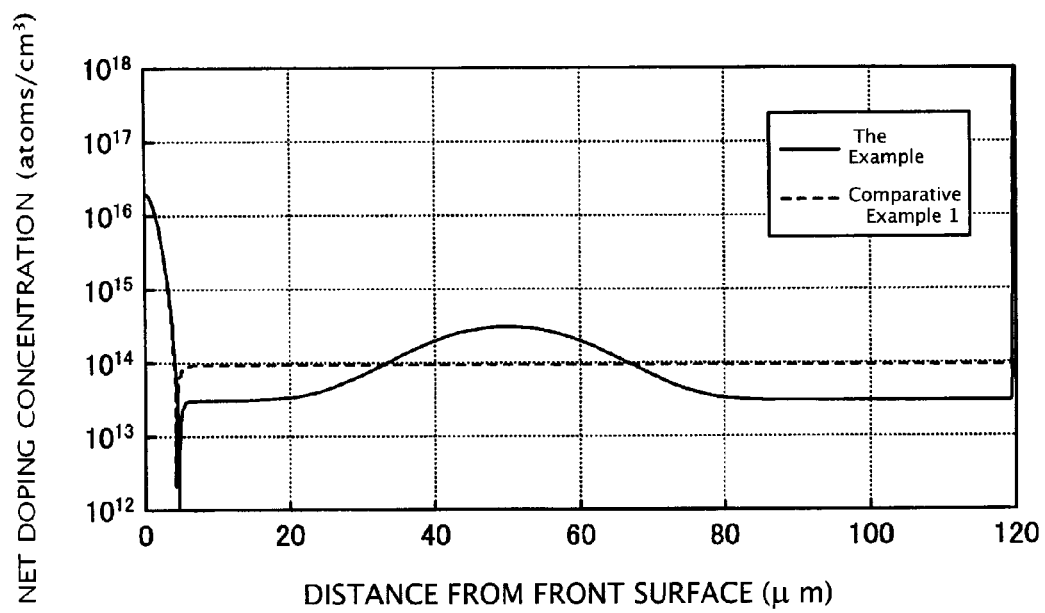
FIG. 13 is a graph illustrating the net doping concentration for comparison between the Example (first embodiment) and Comparative Example 1.

FIG. 13 is a graph showing the net doping concentration in each of the first embodiment (the Example) and Comparative Example 1. In FIG. 13, the vertical axis shows the net doping concentration and the horizontal axis shows the distance from the wafer surface (proton irradiation surface). In FIG. 13, the solid line indicates the net doping concentration of the Example, and the broken line indicates the net doping concentration of Comparative Example 1. As shown in FIG. 13, the net doping concentration of the Example exhibits a peak at a 50 μm-deep position to fulfill the pinning effect whereas the net doping concentration of Comparative Example 1 changes little. This is because donors are produced little by electron beam irradiation or helium ion irradiation. Accordingly, in Comparative Example 1, the net doping concentration of a region (first semiconductor layer) in a depth range of about 5 μm to 120 μm, both inclusively, is substantially equal to the bulk concentration ($9.1 \times 10^{13}$ atoms/cm$^3$, specific resistance: 50 Ωcm).

Figure 14:
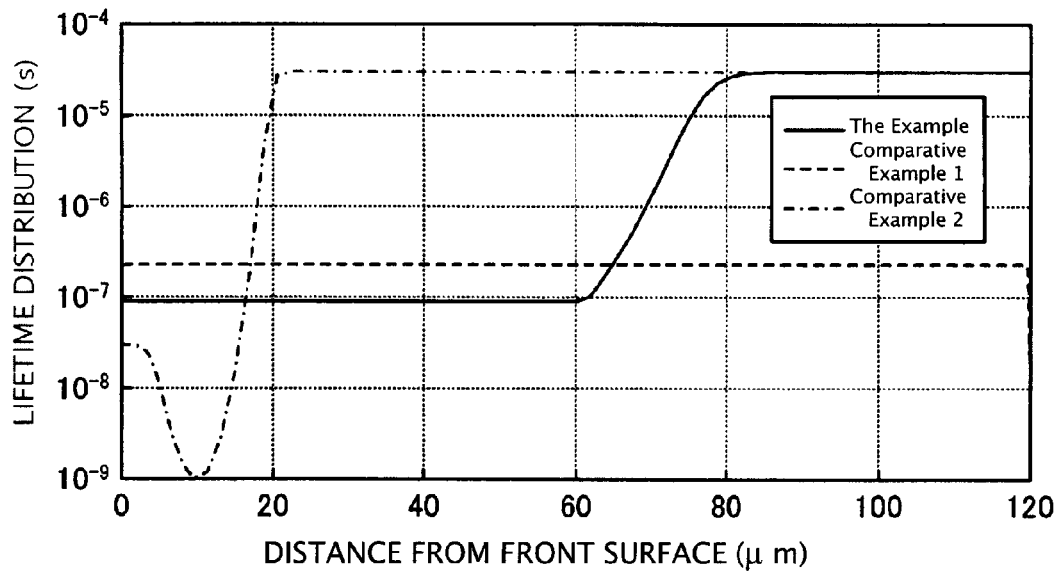
FIG. 14 is a graph showing the lifetime distribution of minority carriers (holes) for comparison between the Example (first embodiment) and each of Comparative Examples 1 and 2.
Figure 15:
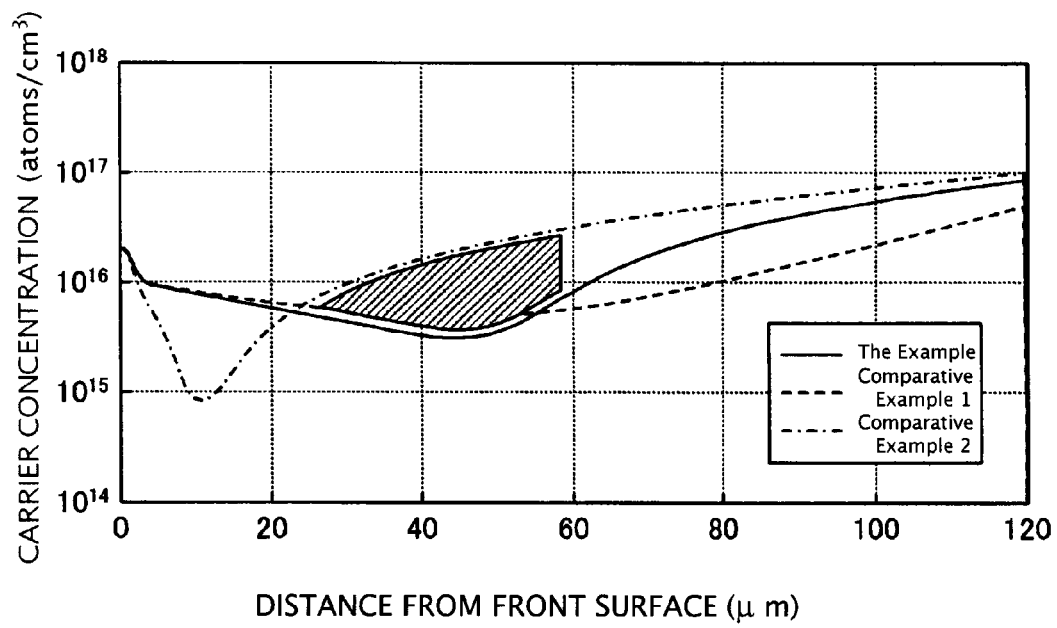
FIG. 15 is a graph illustrating the carrier (hole) concentration at the time of conduction for comparison between the Example and each of Comparative Examples 1 and 2.

FIG. 14 is a graph showing the lifetime distribution of minority carriers (holes) in each of the first embodiment (the Example) and Comparative Examples 1 and 2. In FIG. 14, the vertical axis shows the lifetime and the horizontal axis shows the distance from the wafer surface (proton irradiation surface). FIG. 15 is a graph showing the carrier (hole) concentration at the time of current conduction in each of the first embodiment (the Example) and Comparative Examples 1 and 2. In FIG. 15, the vertical axis shows the carrier concentration and the horizontal axis shows the distance from the wafer surface (proton irradiation surface).

In FIG. 15, the carrier concentration in forward conduction of a current with a current density of 200 A/cm$^2$ was calculated by device simulation. ISE-TCAD R10.0, Dessis made by ISE Corp. was used for the device simulation. In FIG. 14 or 15, the solid line indicates the lifetime distribution or carrier concentration of the Example, the broken line indicates the lifetime distribution or carrier concentration of Comparative Example 1, and the one-dot chain line indicates the lifetime distribution or carrier concentration of Comparative Example 2. As shown in FIG. 15, in the Example, the carrier concentration at the time of current conduction is minimized at a depth of about 50 μm, increases suddenly from the minimum and then further increases while the increasing rate per unit distance decreases. This is because the region deeper than about 70 μm is a non-killer region whose lifetime is long. As shown in FIG. 14, the lifetime of this region is not shorter than 20 μs so that the spreading length of carriers on this occasion exceeds 100 μm. Accordingly, the concentration of electrons implanted into the wafer is reduced little by recombination, so that the carrier concentration distribution as shown in FIG. 15 is obtained.

On the other hand, in Comparative Example 1, the carrier concentration at the time of current conduction in a region deeper than about 70 μm takes a low value, which is not higher than 30% of the carrier concentration of the Example. Moreover, the carrier concentration at the time of current conduction in a region 0-50 μm deep is higher than the carrier concentration at the time of current conduction in the Example. This is because defects are induced to the first semiconductor layer by electron beam irradiation so that the lifetime is shortened uniformly. As shown in FIG. 14, the lifetime value of Comparative Example 1 is about 1 μs or shorter so that the spreading length of carriers on this occasion is about 10 μm. Accordingly, the concentration of electrons implanted into the wafer from the rear surface is attenuated remarkably, so that the carrier concentration of a region of the first semiconductor layer deeper than about 70 μm is reduced by about 30% in comparison with the Example. Hence, the possibility of spreading of the space charge region cannot be suppressed.

In Comparative Example 2, it is commonly known that the peak value of lattice defects caused by helium ion irradiation is in a position in the first semiconductor layer and closer to the interface between the first and second semiconductor layers. This is because a forward voltage drop of about 1.70V can be obtained when helium ion irradiation is performed in the condition where the projected range coincides with this position. Specifically, helium ion irradiation is performed, for example, in the condition where the acceleration voltage of a cyclotron is set at 24 MeV. In this case, the projected range of helium ions is about 316 μm. When an aluminum absorber having the same stopping function as that of silicon is used in the condition where the thickness of the aluminum absorber is set at 301 μm, helium atoms can be localized at a depth of about 10 μm from a surface of an aluminum electrode, e.g., with a 5 μm thickness, provided in the wafer surface. Accordingly, the carrier concentration distribution as shown in FIG. 15 is obtained at the time of current conduction.

As shown in FIG. 15, the carrier concentration of Comparative Example 2 is wholly higher than that of the Example though the forward voltage drop in Comparative Example 2 has the same value as the forward voltage drop in the Example. Moreover, in Comparative Example 2, the carrier concentration is minimized in a region about 10 μm deep and the minimum value of the carrier concentration is about $1 \times 10^{15}$ atoms/cm$^3$ which is one digit smaller than those of the Example and Comparative Example 1. This is because extremely small-value and narrow lifetime reduction is performed in the region about 10 μm deep. This carrier concentration distribution brings a large difference in the waveform of reverse recovery characteristic described later.

Figure 16:
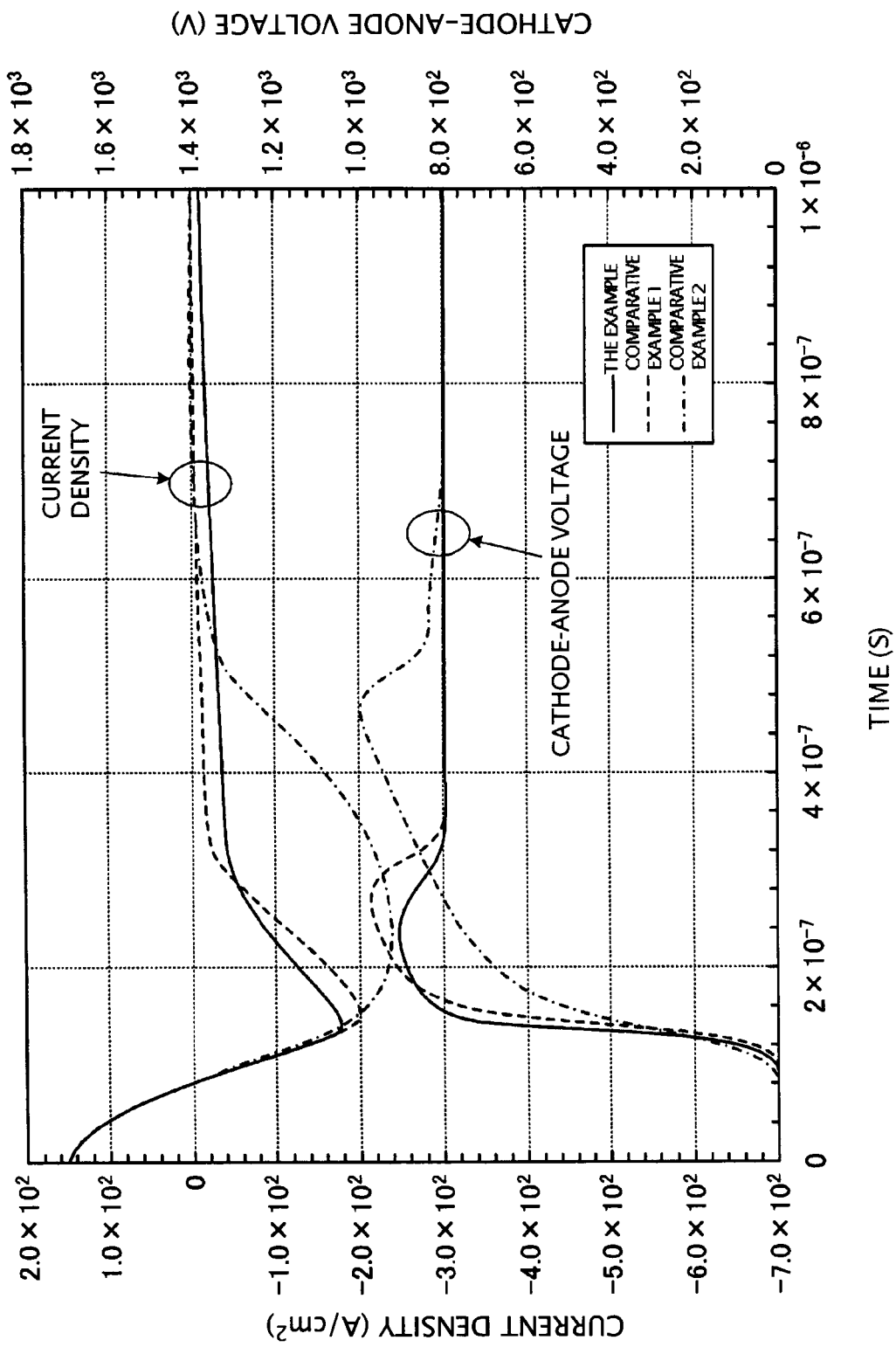
FIG. 16 is a graph illustrating waveforms of reverse recovery characteristics of diodes.
Figure 17:
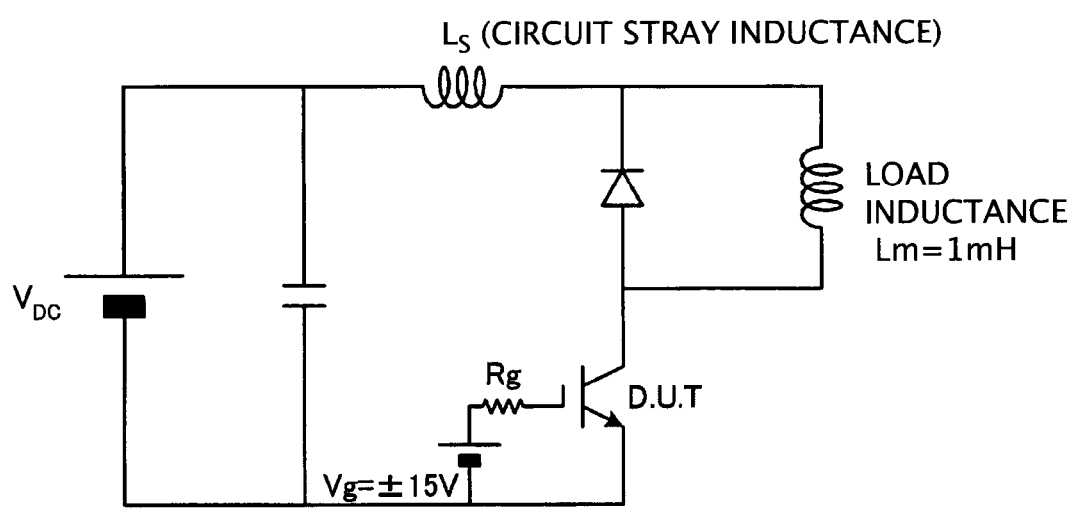
FIG. 17 is a schematic diagram of a snubberless circuit.

The waveform of reverse recovery characteristic shown in FIG. 16 is a waveform of reverse recovery characteristic of a diode when an IGBT is turned on by a snubberless circuit 130 shown in FIG. 17 with respect to a forward current with a rating current density of 200 A/cm$^2$. The snubberless circuit 130 is a single-phase chopper circuit in which the first embodiment as the Example is arranged in series with D.U.T. The load inductance Lm of a main circuit of the snubberless circuit 130 is 1 mH and the circuit stray inductance Ls of the main circuit is 270 nH. The gate drive voltage is ±15V and the DC bus voltage value is 800V. The current decreasing rate at the time of forward commutation is about 4000 A/cm$^2$.

In FIG. 16, the left vertical axis shows the current density, the right vertical axis shows the cathode-anode voltage, and the horizontal axis shows time. In FIG. 16, the solid line indicates the current density or cathode-anode voltage of the Example, the broken line indicates the current density or cathode-anode voltage of Comparative Example 1, and the one-dot chain line indicates the current density or cathode-anode voltage of Comparative Example 2.

As shown in FIG. 16, the current density decreasing rate after reverse recovery is the lowest in the Example and the second lowest in Comparative Example 1. The current density decreasing rate after reverse recovery in Comparative Example 2 is far higher than those in the Example and Comparative Example 1. The surge voltage (cathode-anode voltage) at reverse recovery corresponding to the current density decreasing rate is the lowest (about 100V) in the Example, the second lowest in Comparative Example 1 and the highest in Comparative Example 2.

Particularly in Comparative Example 2, the change rate of the cathode-anode voltage decreases after 0.2 μs so that the reverse recovery charge (charge stored in the inside of the semiconductor device at forward current conduction) increases by three times or more compared with those of the Example and Comparative Example 1. This is because the carrier concentration of Comparative Example 2 is high as shown in FIG. 15.

The width of the space charge region (high electric field intensity region) spread in the inside of the device when the voltage of the diode is brought close to the DC bus voltage value with the advance of reverse recovery is equal to a distance from the PN junction surface to a position where the impurity concentration in the broad buffer structure is maximized, that is, a distance of about 50 μm from the PN junction surface. Incidentally, carriers in the space charge region have to be swept out at the time of reverse recovery. Accordingly, the current value at the time of reverse recovery is decided by the integrated carrier concentration of the space charge region.

As shown in FIG. 15, the Example and Comparative Example 1 are substantially equal to each other in the integrated carrier concentration of the space charge region. On the other hand, the integrated carrier concentration of the space charge region in Comparative Example 2 is higher by the hatched portion in FIG. 15, that is, by about 4 times, than those in the Example and Comparative Example 1. Accordingly, the current density at the time of reverse recovery and the reverse recovery charge increase. Moreover, the increase of such holes brings increase of electric field intensity of the space charge region during reverse recovery to thereby cause an avalanche breakdown during switching, that is, a dynamic avalanche phenomenon. When the avalanche phenomenon occurs, the voltage change rate decreases because the electric field intensity does not increase any more so that the voltage held in the space charge region does not increase. For this reason, in Comparative Example 2, it is difficult to perform a switching operation small (quick) in reverse recovery time and soft in recovery.

Figure 18:
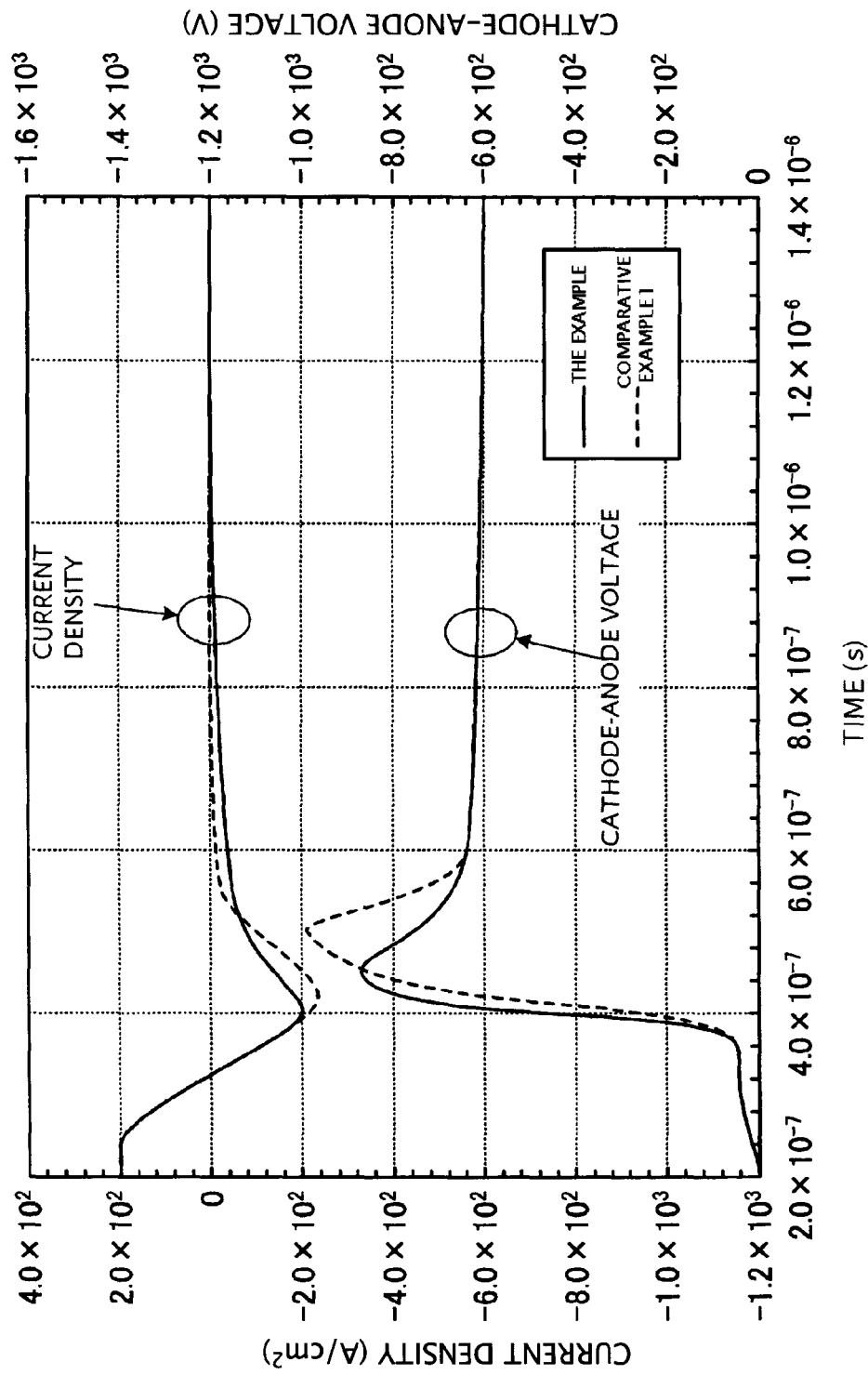
FIG. 18 is a graph illustrating actually measured waveforms of the Example (first embodiment) and the semiconductor device according to Comparative Example 1.

FIG. 18 shows the actually measured waveform in each of the Example and Comparative Example 1. The waveform in FIG. 18 is a waveform when reverse recovery is performed at a DC bus voltage of 600V in the condition where a forward current with a rating current density of 200 A/cm² flows in the same circuit (FIG. 17) as used for simulation. In FIG. 18, the solid line indicates the current density or cathode-anode voltage of the Example, and the broken line indicates the current density or cathode-anode voltage of Comparative Example 1.

In Comparative Example 1, electron beam irradiation was performed at a dose quantity of 120 kGy. Heat treatment was then performed at a temperature of 350° C. for 60 minutes in the same manner as in the Example. Incidentally, the switching IGBT is a field stop type IGBT of standard 1200V/150 A (U-series IGBT made by Fuji Electric Device Technology Co., Ltd.). The gate resistance of the switching IGBT is 0ω on the ON side (external) and 39ω on the OFF side.

As shown in FIG. 18, the same tendency as in the simulation (FIG. 16) can be reproduced even by the actually measured values. Accordingly, the Example is smaller in current at the time of reverse recovery than Comparative Example 1. For this reason, it is understood that soft recovery and quick reverse recovery time are obtained. Moreover, the Example is lower by about 130V in surge voltage at the time of reverse recovery than Comparative Example 1.

Figure 19:
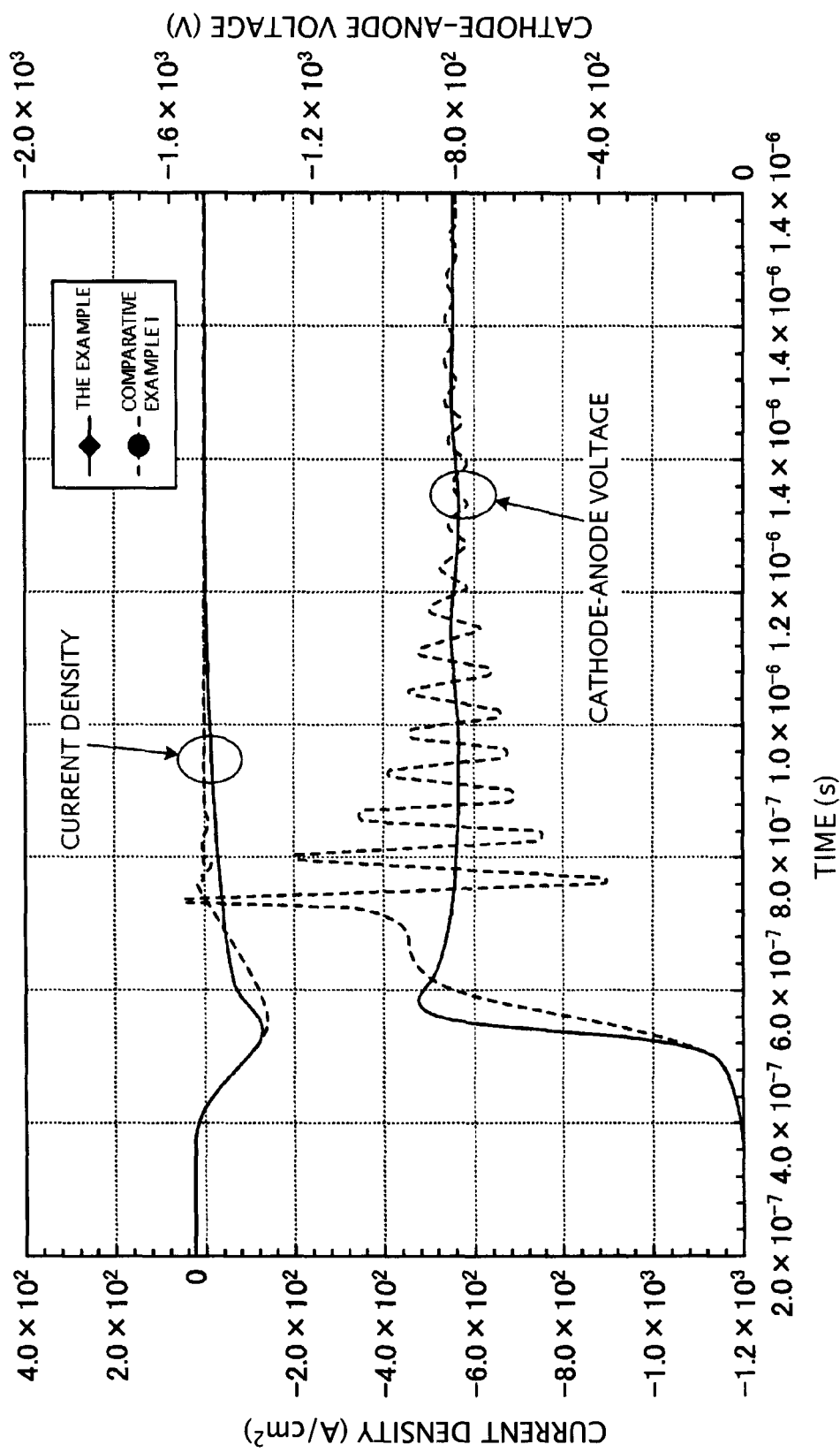
FIG. 19 is a graph illustrating actually measured waveforms of the semiconductor device according to the Example and Comparative Example 1 when a minute electric current passes through each of the semiconductor devices.

FIG. 19 shows the waveform when reverse recovery is performed at a DC bus voltage of 800V in the condition where a minute current (e.g. 20 A/cm²) about 1/10 as large as the rating current flows in each semiconductor device shown in FIG. 18. As disclosed in Patent Document 2, in the case of the minute current, oscillation easily occurs in the semiconductor device because the stored carrier concentration at the minute current is lower than that at the rating current. Accordingly, as shown in FIG. 19, oscillation occurs in Comparative Example 1, so that the surge voltage is about 1600V. On the contrary, oscillation is suppressed in the Example. In addition, the surge voltage in the Example is about 900V, which is lower than that in Comparative Example 1.

Accordingly, the Example can perform a switching operation quick in reverse recovery time and soft in recovery in comparison with Comparative Examples 1 and 2.

Figure 20:
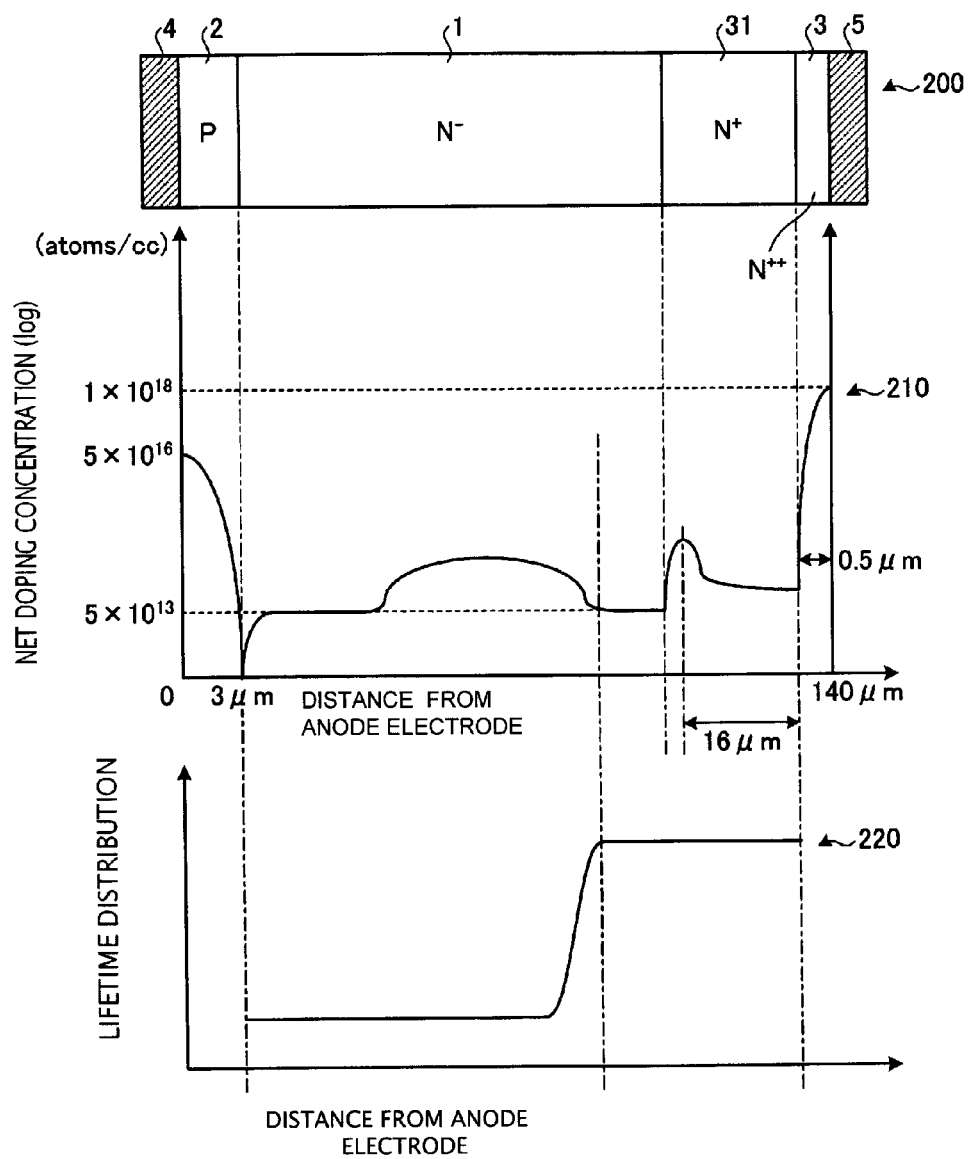
FIG. 20 schematically illustrates the cross-sectional configuration, net doping concentration, and lifetime distribution of a second embodiment of a semiconductor device according the present invention.

Referring to FIG. 20, which illustrates the second embodiment, the semiconductor device 200 includes a fourth semiconductor layer 31 as an N⁺ cathode stopper layer disposed between the third semiconductor layer 3 as an N⁺⁺ cathode layer and the first semiconductor layer 1 as an N⁻ drift layer, and higher in concentration than the bulk concentration and lower in concentration than the third semiconductor layer 3.

The fourth semiconductor layer 31 is a high concentration stopper layer for stopping a depletion layer at a depth of 5-20 μm. Various defects, such as roughness and particles produced in grinding, are produced in the rear surface of the wafer. The fourth semiconductor layer 31 can prevent the depletion layer spread at the time of reverse biasing from reaching the defects in the rear surface of the wafer and accordingly, can prevent the leakage current from increasing. The provision of the fourth semiconductor layer 31 permits the percentage of leakage current defectives to be smaller than 5% in electrical measurement of chips before wafer cutting.

As shown in a characteristic graph 210 of the distance from the anode electrode versus the net doping concentration (log) in FIG. 20, the net doping concentration of the fourth semiconductor layer 31 has a peak in the vicinity of the interface between the fourth semiconductor layer 31 and the first semiconductor layer 1, and decreases with a gradient toward the first and third semiconductor layers 1 and 3.

As shown in a characteristic graph 220 of the distance from the anode electrode versus the lifetime distribution in FIG. 20, the lifetime of the fourth semiconductor layer 31 is substantially equal to the initial large value (20 μs or longer) of the bulk. This is because protons with a dose quantity of $1 \times 10^{13}$ atoms/cm² or larger are ion-implanted into the wafer from the rear surface of the wafer at an acceleration voltage of 1 MeV for forming the fourth semiconductor layer 31 so that the lifetime of the region irradiated with protons becomes substantially equal to the initial large value (20 μs or longer) of the bulk.

To provide reverse recovery of the diode as soft recovery, the carrier concentration on the cathode side has to increase as shown in FIG. 15. It is therefore preferable that the lifetime be kept longer. However, when the fourth semiconductor layer 31 is formed by proton irradiation, the region irradiated with protons is formed as a short lifetime region. In the short lifetime region, exhaustion of stored carriers occurs at the time of reverse recovery to thereby cause snappy recovery and oscillation. Therefore, the lifetime of the short lifetime region has to be recovered to a sufficient long value after proton irradiation. To recover the lifetime of the region irradiated with protons, irradiation and heat treatment (annealing temperature: 450° C. or higher) can be performed in the condition where the leakage current is sufficiently small. Because it is preferable that the temperature for heat-treating the broad buffer structure be not higher than 350° C. as described above, it is necessary to form the fourth semiconductor layer 31 before the formation of the broad buffer structure.

However, when the fourth semiconductor layer 31 is formed before the formation of the broad buffer structure, there is a problem in that the wafer has to be irradiated with protons from the rear surface of the wafer at a high acceleration voltage before the rear surface of the wafer is ground. When, for example, a 6 inch-diameter silicon wafer is used, the initial thickness of the wafer is set at 500 μm so that a surface structure (P anode layer, oxide layer, contact formation and aluminum electrode formation) is formed without warping the wafer. Then, the wafer is irradiated with protons from the rear surface of the wafer to form the fourth semiconductor layer 31. For example, to set the projected range at a position 110 μm deep from the wafer surface, the projected range needs to be about 390 μm distant from the rear surface of the wafer. For this reason, proton irradiation has to be performed at an acceleration voltage of 7 MeV or higher without any absorber. In this case, the FWHM becomes a value of not smaller than 20 μm, so that the fourth semiconductor layer 31 is located on the anode side about 10 μm distant from the projected range. Therefore, a buffer layer of 20 μm in total is required and, accordingly, the wasteful distance increases so that the conduction loss increases. This situation is applied also to the case where, for example, the projected range is formed at a position 120 μm deep from the wafer surface. Even in this case, the fourth semiconductor layer 31 becomes longer by about 10 μm.

On the other hand, when the fourth semiconductor layer 31 is formed after the rear surface of the wafer is ground, there is a problem in that the number of processes where the wafer is treated in a thin state increases. The thickness of the wafer having the rear surface of the wafer ground is about 120-150 μm for 1200V class and 50-80 μm for 600V class, that is, the wafer is very thin. In this condition, it is necessary to perform formation of the broad buffer structure (proton irradiation from the wafer surface and heat treatment at a temperature of 350° C. or lower), formation of the third semiconductor layer 3 (ion implantation of phosphorus or arsenic from the rear surface of the wafer and annealing of the wafer), formation of a passivation film of an edge structure based on a film of polyimide or the like, and formation of an electrode in the rear surface of the wafer. Particularly for forming the passivation film, the thin wafer has to be carried to various apparatuses. When the thin wafer is carried, there is a high possibility that breaks or cracks will occur in the wafer. It is therefore necessary to form the broad buffer structure by proton irradiation before the rear surface of the wafer is ground.

To solve these problems, the second embodiment is produced by the following method. First, as shown in FIG. 2A, the second semiconductor layer 2 serving as the P anode layer, a guard ring edge structure (not shown), the insulating film 6 and the anode electrode 4 are formed by a standard diode forming process in the same manner as in the first embodiment. Then, a passivation film (not shown) is formed.

Then, as shown in FIG. 2B, the FZ wafer 10 is irradiated with protons from the side of the anode electrode 4. On this occasion, the acceleration voltage can be, for example, 7.9 MeV, and the dose quantity of protons can be, for example, $3.0 \times 10^{12}$ atoms/cm². The projected range of protons is set at a position 50 μm distant from the interface between the semiconductor of the FZ wafer 10 and the anode electrode 4.

Then, heat treatment is performed, for example, at 350° C. for 1 hour to recover crystal defects 11. As shown in FIG. 2C, the high concentration region 12 is consequently formed in the vicinity of a position 50 μm deep from the interface between the semiconductor of the FZ wafer 10 and the anode electrode 4. The required broad buffer structure is formed from the high concentration region 12. Then, as shown in FIG. 2D, the rear surface of the wafer is ground or wet-etched so that the thickness of the wafer of about 500 μm is reduced, for example, to 120 μm.

Figure 21A:
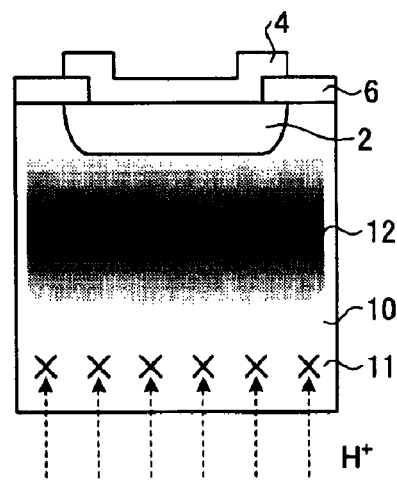
FIG. 21A-21C schematically illustrate the method of producing the semiconductor device of FIG. 20.

Then, as shown in FIG. 21A, the FZ wafer 10 is irradiated with protons from the cathode side surface of the FZ wafer 10. On this occasion, the acceleration voltage can be, for example, 700 keV and the dose quantity of protons can be, for example, $1 \times 10^{14}$ atoms/cm². In this case, the projected range of protons can be set at a position 10 μm distant from the cathode side surface (proton irradiation surface) of the FZ wafer 10. In FIG. 21A, the reference character "X" refers to crystal defects 11 produced in the FZ wafer 10 by proton irradiation.

Figure 21B:
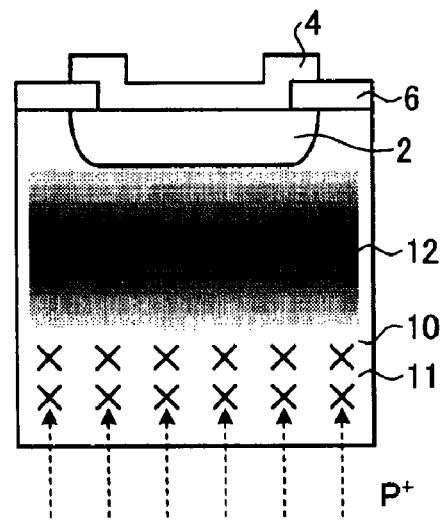

Then, as shown in FIG. 21B, phosphorus ions are implanted into the cathode side surface (proton irradiation surface) of the FZ wafer 10. On this occasion, the acceleration voltage can be, for example, 50 keV, and the dose quantity of phosphorus can be, for example, $1 \times 10^{15}$ atoms/cm². Then, the FZ wafer 10 is irradiated with YAG 2ω laser beams from the cathode side of the FZ wafer 10 using the double pulse method (delay time 300 ns for example). Both proton and phosphorus are annealed simultaneously by the YAG 2ω laser beam irradiation. By such YAG 2ω laser beam irradiation, phosphorus implanted into a region 1 μm or less distant from the cathode side surface (proton and phosphorus irradiation surface) of the FZ wafer 10 is melted at a temperature of 1400° C. or higher for 1 μs. For this reason, implantation damage is recovered so that phosphorus is electrically activated. The third semiconductor layer 3 is consequently formed.

Further, a region 10 μm deep from the proton and phosphorus irradiation surface is heated to a temperature of about 1050° C. for a time of about 1 μs. In this case, because the temperature is far higher than about 400° C. where protons are provided as donors but the time is very short, the same effect as due to annealing at a temperature of 400° C. for 1 hour can be obtained. Accordingly, protons are provided as donors, so that the lifetime is recovered to a sufficient long value of about 20 μs. The fourth semiconductor layer 31 is consequently formed.

Figure 21C:
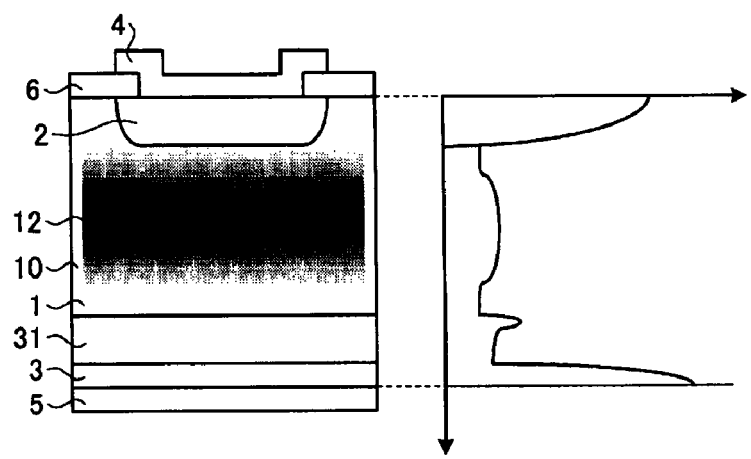

Finally, as shown in FIG. 21C, a cathode electrode 5, which is in ohmic contact with the third semiconductor layer 3, is formed, completing the semiconductor device (diode). The portion of the FZ wafer 10 between the second and fourth semiconductor layers 2 and 31 serves as the first semiconductor layer 1. The characteristic graph in FIG. 21C shows the net doping concentration profile corresponding to the semiconductor device.

According to the second embodiment, the broad buffer structure can be formed before the rear surface of the wafer is ground. In addition, because the fourth semiconductor 31 can be formed thinly, loss can be suppressed.

Incidentally, it is preferable that the fourth semiconductor layer 31 be formed in the condition where the FWHM of protons is not larger than about 1 μm. This is because formation of the fourth semiconductor layer 31 into a thin layer permits the distance to be reduced to thereby suppress increase of conduction loss. In this case, proton irradiation is performed at an acceleration voltage of about 1 MeV.

It is preferable that the depth of the fourth semiconductor layer 31, that is, the projected range Rp of protons, be set to be not smaller than 3 μm. This is for the purpose of suppressing influence on the characteristic of the rear surface of the wafer. Specifically, this is because, as a result of measurement of the percentage of leakage current defectives in each of diodes prepared to have various finished thicknesses, the percentage of defectives, when an end of the depletion layer is 3 μm or less distant from the rear surface of the wafer in the condition where a reverse bias voltage of 1200V is applied to the diode takes a high value not lower than 30% but the percentage of defectives when the end of the depletion layer is 3 μm or more distant from the rear surface of the wafer, is remarkably reduced to 5% or lower.

Because the acceleration voltage to set the projected range of protons at 3 μm is 300 keV, it is preferable that the acceleration voltage for formation of the fourth semiconductor layer 31 be in a range of 300 keV to 1 MeV, both inclusively. When the acceleration voltage is in this range, the projected range of protons is in a range of 3 μm to 10 μm, both inclusively, and the FWHM of protons is in a range of from 0.2 μm to 0.5 μm, both inclusively. Incidentally, the fourth semiconductor layer 31 can be thicker than 10 μm if increase of conduction loss of the diode can be allowed in the actual operation of an inverter or the like. In this case, the acceleration voltage can be 700 keV or higher.

The laser beam for performing annealing can be any all-solid-state laser of $YVO_4$ 2ω or ELF 2ω, a gas laser such as an excimer laser or a He—Ne laser, a GaN semiconductor laser, a Ga-containing semiconductor laser such as $Al_xGa_{1-x}As$ or $In_xGa_{1-x}As$, or a ruby laser. Further, the aforementioned laser beams can be used in combination for irradiation.

Accordingly, the second embodiment can obtain the same effect as the first embodiment.

The present technique can be applied not only to diodes but also to general vertical type IGBTs or reverse-blocking IGBTs. In an IGBT or the like to which the present technique is applied, turn-off with low loss and suppressed oscillation can be achieved. Particularly for production of a reverse-blocking IGBT, an FZ bulk wafer is used and a gate structure, an emitter structure, and an edge structure are produced in the front surface of the wafer. Then, after the wafer is irradiated with an electron beam at a dose quantity of 100 kGy or smaller, the rear surface of the wafer is ground and polished to set the final thickness of the whole wafer at about 100 μm, and the surface exposed by grinding is implanted with boron ions and irradiated with a laser beam to activate boron.

On the other hand, at the time of turn-off, the depletion layer is spread from the front surface side of the wafer to extinguish carriers but sudden extinction of carriers can be suppressed so that smooth turn-off without oscillation can be performed. Accordingly, a low loss and soft recovery diode or an IGBT capable of turning off smoothly without oscillation can be produced. In a power conversion apparatus, such as a PWM inverter using an IBGT module having such characteristics, occurrence of overvoltage destruction and EMI noise can be suppressed.

Figure 22A:
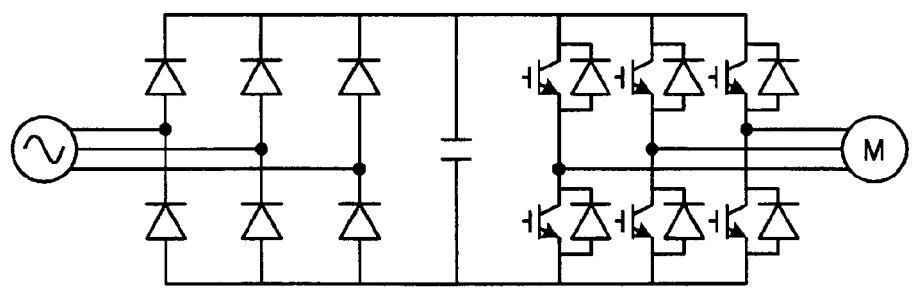
FIG. 22A-22D schematically illustrate applied examples of how IGBTs and diodes according to the invention can be used.
Figure 22B:
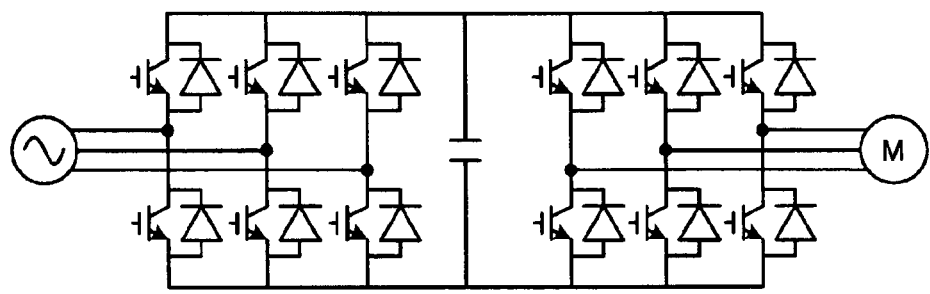

FIGS. 22A-22D illustrate some examples of IGBTs and diodes formed by the first and second embodiments. Converter-inverter circuits shown in FIGS. 22A and 22B can control induction motors, servomotors, etc., efficiently and are widely used in industries, electric railroads, etc. FIG. 22A shows an example of application of diodes to a converter portion. FIG. 22B shows an example of application of IGBTs to a converter portion. In each of the examples, IGBTs are applied to an inverter portion. A free wheeling diode (FWD) is connected in parallel with each IGBT.

Figure 22C:
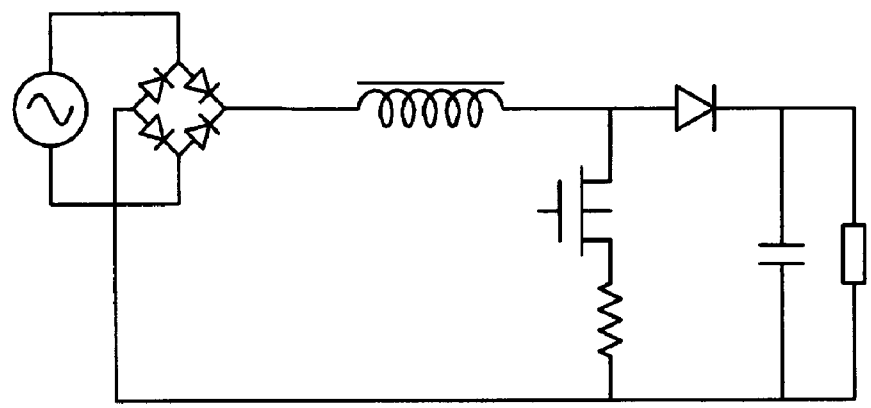
Figure 22D:
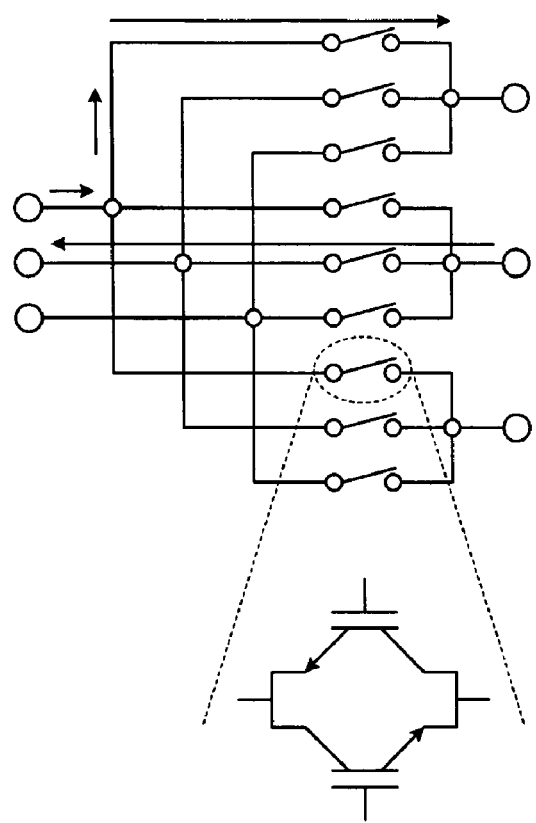

A power factor control circuit (PFC circuit) shown in FIG. 22C is a circuit that controls an input current of AC-AC conversion in a sinusoidal pattern to thereby improve the waveform and used for a switching power supply. A circuit diagram shown in FIG. 22D is an overall view of a matrix converter circuit and shows the configuration of a switching portion of the matrix converter circuit. The matrix converter is a system for performing direct conversion not by using a DC smoothing circuit but by using a switching element capable of blocking two-way currents.

The present technique can be applied not only to a 1200V class but also to a 600V class, a 1700V class, or a withstand voltage class higher than the 1700V class. For example, in the case of a 1700V class, the specific resistance of the wafer can be 80-200 Ωcm and the final thickness of the wafer can be 120-200 μm. In the case of a 3300V class, the specific resistance of the wafer can be 200-500 Ωcm and the final thickness of the wafer can be 250-400 μm.

As described above, in accordance with the semiconductor device and the method of producing the semiconductor device, soft recovery characteristics as well as high-speed and low-loss characteristics can be achieved, while suppressing the kinked waveform of the leakage current.

As described above, the semiconductor device and the method of producing the semiconductor device according to the invention are useful for a power semiconductor device and particularly adapted to a diode or an IGBT having soft recovery characteristics as well as high-speed and low-loss characteristics and having environmental friendliness.

The present invention is not to be limited to the aforementioned embodiments. For example, various values such as sizes, concentrations, voltage values, current values, treatment conditions, such as temperature and time, etc., described in the embodiments are only exemplary. The invention is not limited to those values.

While the present invention has been particularly shown and described with reference to exemplary embodiments and examples, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Applications 2008-029257 filed on 8 Feb. 2008. The disclosure of the priority application in its entirety, including the drawings, claims, and the specification thereof, is incorporated herein by reference.

What is claimed is:

1. A semiconductor device comprising:
   a semiconductor substrate of a first conductivity serving as
      a first semiconductor layer of the first conductivity type having a first principal surface and a second principal surface;

a second semiconductor layer of a second conductivity type having a higher impurity concentration than the first semiconductor layer and in contact with at least part of the first semiconductor layer on the first principal surface of the first semiconductor layer;

a third semiconductor layer of the first conductivity type having a higher impurity concentration than the first semiconductor layer and on a side of the second principal surface of the first semiconductor layer;

a first electrode in contact with at least part of the second semiconductor layer; and a second electrode in contact with at least part of the third semiconductor layer, wherein the first semiconductor layer includes at least one region where the impurity concentration is locally maximized so that the impurity concentration thereof decreases from the locally maximized region toward both the second and third semiconductor layers, and wherein a carbon concentration of the semiconductor substrate is in a range of $6.0 \times 10^{15}$ to $2.0 \times 10^{17}$ atoms/cm$^3$, both inclusively.

2. The semiconductor device according to claim 1, wherein the third semiconductor layer is in contact with the first semiconductor layer.

3. The semiconductor device according to claim 2, wherein carrier lifetime values of minority carriers in a region extending from an interface between the first and second semiconductor layers to a third semiconductor layer-side end portion X1 where the impurity concentration of the first semiconductor layer is locally maximized are shorter than carrier lifetime values of minority carriers in a region extending from the end portion X1 to an interface between the first and third semiconductor layers.

4. The semiconductor device according to claim 3, wherein the carrier lifetime values of minority carriers in the region extending from the interface between the first and second semiconductor layers to the third semiconductor layer-side end portion X1 where the impurity concentration of the first semiconductor layer is locally maximized are substantially uniform.

5. The semiconductor device according to claim 4, wherein a difference between a minimum and a maximum of the carrier lifetime values of minority carriers in the region extending from the interface between the first and second semiconductor layers to a position closer to the third semiconductor layer-side end portion X1 where the impurity concentration of the first semiconductor layer is locally maximized is not longer than 10 times.

6. The semiconductor device according to claim 3, wherein the carrier lifetime values of minority carriers in the region extending from the third semiconductor layer-side end portion X1 where the impurity concentration of the first semiconductor layer is locally maximized to the interface between the first and third semiconductor layers are not shorter than 20 µs.

7. The semiconductor device according to claim 2, wherein the region where the impurity concentration of the first semiconductor layer is locally maximized contains hydrogen atoms.

8. The semiconductor device according to claim 7, wherein the hydrogen atoms contained in the region where the impurity concentration of the first semiconductor layer is locally maximized are donors.

9. The semiconductor device according to claim 2, wherein a minimum impurity concentration of the first semiconductor layer is equal to or less than an impurity concentration of the semiconductor substrate and not higher than 20% of the impurity concentration of the region where the impurity concentration of the first semiconductor layer is locally maximized.

10. The semiconductor device according to claim 1, further comprising a fourth semiconductor layer of the first conductivity type provided between and in contact with the first and third semiconductor layers and having a higher impurity concentration than the first semiconductor layer and lower in impurity concentration than the third semiconductor layer.

11. The semiconductor device according to claim 10, wherein a full width at half maximum of the fourth semiconductor layer is in a range of 0.2 µm to 1.0 µm, both inclusively.

12. The semiconductor device according to claim 10, wherein a full width at half maximum of the fourth semiconductor layer is in a range of 0.2 µm to 0.5 µm, both inclusively.

13. A method of producing a semiconductor device comprising:

a semiconductor substrate of a first conductivity serving as a first semiconductor layer of the first conductivity type having a first principal surface and a second principal surface;

a second semiconductor layer of a second conductivity type having a higher impurity concentration than the first semiconductor layer and in contact with at least a part of the first semiconductor layer on the first principal surface of the first semiconductor layer;

a third semiconductor layer of the first conductivity type having a higher impurity concentration than the first semiconductor layer and on a side of the second principal surface of the first semiconductor layer;

a first electrode in contact with at least part of the second semiconductor layer; and a second electrode in contact with at least part of the third semiconductor layer, wherein the first semiconductor layer includes at least one region where the impurity concentration is locally maximized so that the impurity concentration thereof decreases from the locally maximized region toward both the second and third semiconductor layers, and wherein a carbon concentration of the semiconductor substrate is in a range of $6.0 \times 10^{15}$ to $2.0 \times 10^{17}$ atoms/cm$^3$, both inclusively, the method comprising:

a second semiconductor layer forming step of forming the second semiconductor layer in the first principal surface of the semiconductor substrate;

a first irradiating step of irradiating the first principal surface of the semiconductor substrate with hydrogen ions at an acceleration voltage of not lower than 5 MeV;

a heat-treating step of heat treating the semiconductor substrate at a temperature of 200° C. to 350° C., both inclusively, to form the at least one region in the first semiconductor layer where the impurity concentration is locally maximized;

a grinding step of grinding the second principal surface of the semiconductor substrate;

an implanting step of implanting an impurity of the first conductivity type into the ground second principal surface of the semiconductor substrate; and a second irradiating step of irradiating the ground second principal surface implanted with the impurity of the first conductivity type, with a laser beam to electrically activate the implanted impurity and form the third semiconductor layer.

14. The method according to claim 13, wherein the semiconductor further includes a fourth semiconductor layer of the first conductivity type between and in contact with the first and third semiconductor layers and having a higher impurity concentration than the first semiconductor layer and lower in impurity concentration than the third semiconductor layer, wherein the method further comprises:

an intermediate irradiating step of irradiating the ground second principal surface with hydrogen ions before the implanting step, wherein the second irradiating step electrically activates the hydrogen ions irradiated in the intermediate irradiating step to form the fourth semiconductor layer and the impurity of the first conductivity implanted on the implanting step to form the third semiconductor layer.

* * * * *